United States Patent [19]

Inoue et al.

[11] Patent Number: 5,118,982
[45] Date of Patent: Jun. 2, 1992

[54] THICKNESS MODE VIBRATION PIEZOELECTRIC TRANSFORMER

[75] Inventors: Takeshi Inoue; Osamu Ohnishi; Nobuo Ohde, all of Tokyo, Japan

[73] Assignee: NEC Corporation, Japan

[21] Appl. No.: 530,930

[22] Filed: May 30, 1990

[30] Foreign Application Priority Data

| May 31, 1989 | [JP] | Japan | 1-139525 |
| Nov. 17, 1989 | [JP] | Japan | 1-299337 |
| Dec. 1, 1989 | [JP] | Japan | 1-312465 |
| Apr. 16, 1990 | [JP] | Japan | 2-99685 |

[51] Int. Cl.⁵ ............................... H01L 41/08
[52] U.S. Cl. ....................... 310/366; 310/328; 310/359
[58] Field of Search ............. 310/366, 359, 328

[56] References Cited

U.S. PATENT DOCUMENTS

| 2,928,069 | 3/1960 | Petermann | 310/366 |
| 3,401,377 | 9/1968 | Bartlett et al. | 310/366 |
| 3,487,239 | 12/1969 | Schafft | 310/359 |
| 3,562,792 | 2/1971 | Berlincourt et al. | 310/359 |
| 3,590,287 | 6/1971 | Berlincourt | 310/366 |
| 3,659,127 | 4/1972 | Kumon | 310/359 |
| 4,530,139 | 7/1985 | Miller | 29/25.35 |
| 4,876,476 | 10/1989 | Kittaka et al. | 310/366 |

FOREIGN PATENT DOCUMENTS

| 0079778 | 5/1983 | Japan | 310/359 |
| 0196981 | 10/1985 | Japan | 310/359 |
| 0206281 | 9/1986 | Japan | 310/367 |
| 0141791 | 6/1987 | Japan | 310/366 |
| 2205680 | 12/1988 | United Kingdom | 310/328 |

Primary Examiner—Steven L. Stephan
Assistant Examiner—Thomas M. Dougherty
Attorney, Agent, or Firm—Laff, Whitesel, Conte & Saret

[57] ABSTRACT

Low and high impedance thickness mode vibration portions are integrally laminated. Each vibrator portion comprises electrode layers between which a piezoelectric layer polarized in the direction of thickness is interposed. In each vibrator portion, every other electrode layer is connected to respective common external terminals. These common external terminals are of either four-terminal construction consisting two pairs, one pair for the low impedance mode vibrator portion and the other pair for the high impedance thickness mode vibrator portion, or three-terminal construction in which one of each pair are united together into a common terminal. Difference between the impedances is set on difference in the number of electrode layers and/or on difference in dielectric constant between the piezoelectric layers.

6 Claims, 16 Drawing Sheets

THICKNESS MODE VIBRATION PIEZOELECTRIC TRANSFORMER

BACKGROUND OF THE INVENTION

This invention relates to a piezoelectric transformer, and more particularly to a small size type thickness mode vibration piezoelectric transformer using piezoelectric ceramics.

In recent years, for the purpose of miniaturizing power supply unit for communication and computers, the usage of the switching type power supply unit operable in a high frequency range is widely studied and being developed rapidly. For miniaturization of the switching type power supply, many prior arts attempt to use electromagnetic transformers. However, the use of higher frequency is required in many field. In view of this high frequency application, the electromagnetic transformer has many disadvantages involving magnetic material of the electromagnetic transformer, such as sharp increase in hysteresis loss, eddy-current loss and conductor skin-effect loss. Those losses limit the upper limit of practical frequency range to 500 kHz at most.

On the other hand, piezoelectric ceramic transformers (hereinafter, referred to as piezoelectric transformer unless otherwise specified) are operated in resonance, and hence compared with a general electromagnetic transformers, they have many advantages, for example, (a) higher energy density at the same frequency may permit miniaturization; (b) improvement for making incombustible; and (c) no noise due to electromagnetic induction.

A typical conventional piezoelectric transformer known as Rosen type transformer is illustrated in Electronics Letters Mar. 31, 1988, Vol. 24, No. 7, pages 444 to 445. Referring to FIG. 1, description will be given for the case of obtaining output of high electric voltage using the Rosen type transformer. A vibrator portion 1 or low impedance vibrator portion is interposed between electrodes 3 and 4, and polarized in the direction of thickness indicated by an arrow. A generator portion 2 having a high impedance is provided with an electrode 5 at one end face and polarized in the direction of length indicated by another arrow shown. The piezoelectric transformer is operated by applying alternating voltage to external terminals 6 and 7 connected to the drive electrodes 3 and 4, respectively. A longitudinal vibration is excited in transverse effect 31 mode according to an electromechanical coupling coefficient $K_{31}$, and in turn the generator portion 2 is excited in a longitudinal effect longitudinal vibration mode (33 mode) according to an electromechanical coupling coefficient $k_{33}$. As the result, high voltage output is obtained between the terminal 7 and another terminal 8 connected to the electrode 5. On the other hand, for obtaining output of step-down voltage, as appreciated, the high impedance portion undergoing longitudinal effect may be used as the input and the low impedance subjected to transverse effect as the output. To the conventional piezoelectric transformers like this can be applied up to 200 kHz. Further the Rosen type piezoelectric transformer has been found disadvantageous in that any coupling coefficient other than $k_{31}$ which is a very small transverse effect longitudinal vibration mode can not be applied for it, resulting in obtaining a small band width only.

Piezoelectric transformer, different from electromagnetic transformer, has a sharp frequency characteristic of the output voltage to input voltage ratio, which has a peak at the resonant frequency. This resonant frequency depends on the material constants and thickness of material as of piezoelectric ceramics or electrodes, and accordingly may vary with shrinkage and others when manufactured. The resonant frequency however is not always identical with the drive frequency of the external circuit.

With increasing the mechanical quality factor of the piezoelectric transformer, the power transmission efficiency can become higher. After sintering followed by no further processing, it was found to have bad parallel precision and planeness, and give results of a small mechanical quality factor and lower power transmission efficiency.

SUMMARY OF THE INVENTION

An object of the present invention is to provide a piezoelectric transformer operating at high frequencies.

Another object of the present invention is to provide a small size, high efficiency piezoelectric transformer.

A thickness mode vibration piezoelectric transformer in accordance with the present invention comprises a low impedance portion and a high impedance portion stacked on each other. Each portion is composed of at least two electrode layers and at least one piezoelectric material layer polarized in the thickness direction superposed alternately on each other. Every other electrode layer in each portion are connected to each other and to selected one or two of the external terminals. The four-terminal construction includes a pair of terminals for the low impedance portion and another pair of terminals for the high impedance portion. The three-terminal construction has a common terminal to which one of each terminal pair in the four-terminal construction are united.

Another embodiment of thickness mode vibration piezoelectric ceramic transformer according to the invention comprises an insulator layer of a smaller dielectric constant than that of the piezoelectric material between the low and high impedance portions.

The thickness of the piezoelectric ceramic transformer is preferred to be equal to a half wavelength ($\lambda/2$) or one wavelength ($\lambda$) of the drive frequency.

DESCRIPTION OF THE PREFERRED EMBODIMENTS

Figure 1:
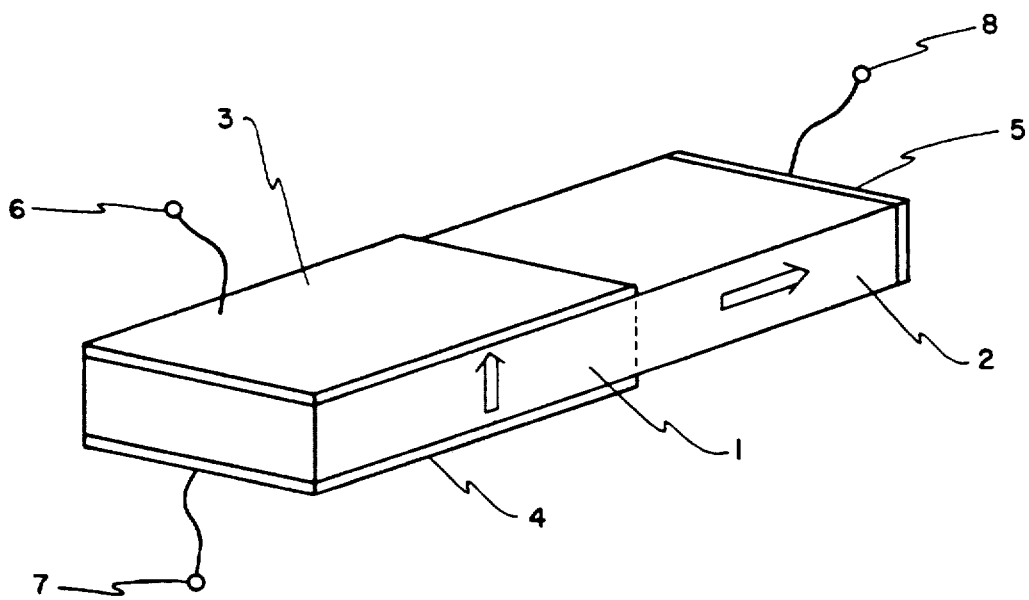
FIG. 1 is a perspective view of a prior art piezoelectric transformer.
Figure 2:
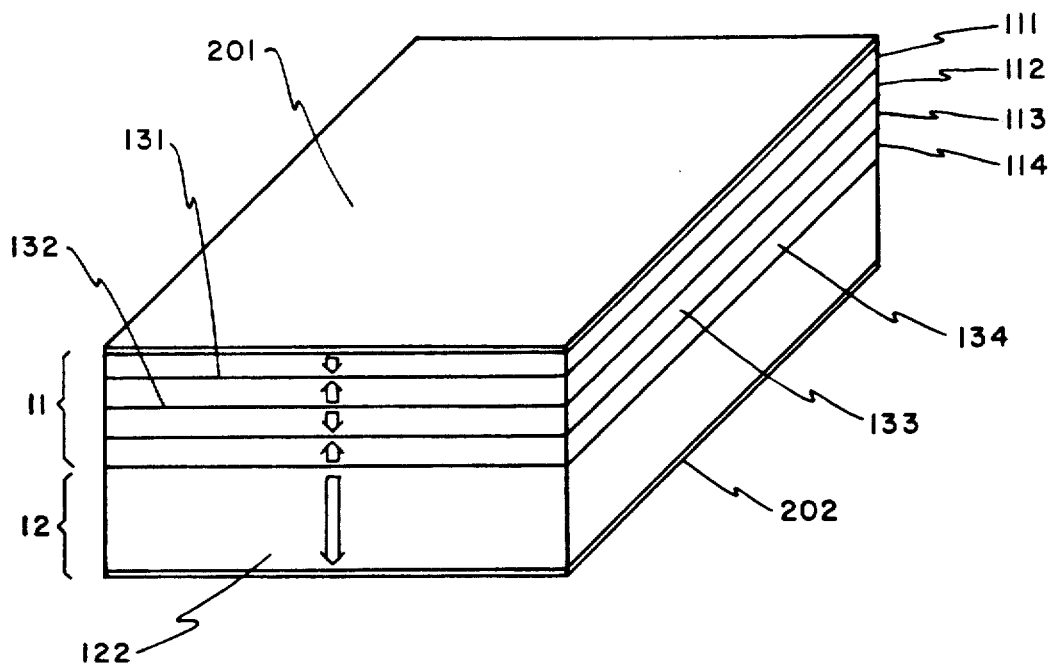
FIG. 2 is a perspective view of a stack of piezoelectric ceramics used in a piezoelectric transformer embodying the first basic construction of the invention.

The first embodiment of piezoelectric transformer according to the invention comprises a low impedance vibrator portion 11 including a plurality of piezoelectric layers 111 through 114 and a high impedance vibrator portion 12 including a piezoelectric layer 122, each layers being integrally laminated, as shown in FIG. 2, and is caused to vibrate in thickness-extensional mode. The portion 11 has a laminated structure which comprises multi-layered piezoelectric layers 111 through 114 each being interposed between electrodes including the top surface electrode layer 201 and internal electrode layers 131 through 134. The high impedance portion 12 is constructed of the bottom electrode layer 202, an internal electrode layer 134 and a single piezoelectric layer 122 interposed between both electrode layers 202 and 134. Polarization in each piezoelectric layer is, as indicated by arrows, in the direction of thickness, respectively. In the low impedance portion 11, the adjusting piezoelectric layers are polarized in opposite directions to each other. It is nothing noteworthy about polarization in the high impedance portion 12 except that it is in the direction of thickness. The piezoelectric transformer having the multi-electrode layer construction as above-mentioned can be fabricated by the laminate/ceramic technique applied to the manufacture of laminated ceramic capacitors or the like, which consists of printing electrodes on green sheets, laminating them and sintering. The piezoelectric transformer fabricated in such a technique can be realized to have a value as thin as 10 to 25 μm in distance between internal electrodes. Thus even if thickness-extensional mode resonance of λ/2 mode (both end free fundamental mode) or λ mode (both end-free secondary mode) is used, also piezoelectric transformer operating in the super-high frequency range of 5-10 MHz band can be realized by the laminate/ceramic technique. The output P (W) of piezoelectric transformer operating in thickness-extensional mode vibration is expressed, based on a simplified consideration from the viewpoint of energy, approximately as $$P \alpha f_r \epsilon^s_{33} \cdot V \cdot k_t^2$$

wherein $f_r$ is thickness-extensional mode resonance frequency, $\epsilon^s_{33}$ is constraint dielectric constant, V is volume of the piezoelectric transformer, and $K_t$ is electromechanical coupling coefficient of thickness-extensional mode vibration. Thus in the piezoelectric transformer, output per unitary volume increases with greater electromechanical coupling coefficient $K_t$ and higher resonant frequency $f_r$ of piezoelectric ceramic resonator, and so the corresponding miniaturization can be expected. Also the transformation ratio is substantially proportional to the square of impedance ratio between both impedance portions 11 and 12. Piezoelectric transformers in accordance with the present invention may be of three (as shown in FIG. 3) or four-terminal (as shown in FIG. 4) construction.

Figure 3:
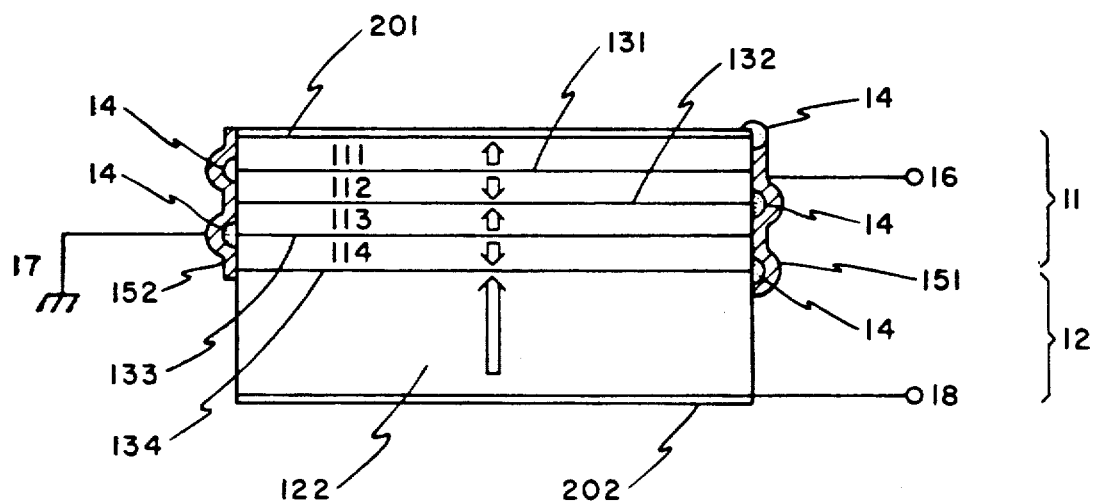
FIG. 3 is a cross-sectional view of an embodiment of the piezoelectric transformer of FIG. 2 having a three-terminal construction.

In the three-terminal construction shown in FIG. 3, a common side conductor layer 151 is secured to one-side ends of the piezoelectric layers at which the internal electrodes 131 and 133 are exposed. They are electrically interconnected, and connected to a first external terminal 16. The other electrodes and the side conductor layer 151 are electrically isolated by insulator layers 14 from other electrodes. Another side conductor layer 152 is secured to the other-side ends of the piezoelectric layers so that it is connected commonly to internal electrodes 132 and 134 and the top surface electrode 201 and also connected to a second external terminal 17. It is electrically isolated by insulator layers 14 from internal electrodes 131 and 133. As stated above, in the low impedance vibrator portion 11 electric connection is interconnected every other electrode, each group of electrodes is connected to external terminals 16 and 17, respectively. The adjacent ones of the piezoelectric layer 111 through 114 are polarized opposite directions as indicated by arrows shown. On the other hand, one of the external terminals of the high impedance vibrator portion 12 is a third external terminal 18 connected to the bottom electrode 202, and the other is united with the external terminal 17 connected to the lowest internal electrode 134. The second external terminal 17 is grounded and used as a common external terminal to the low and high impedance vibrator portions 11 and 12.

Figure 4:
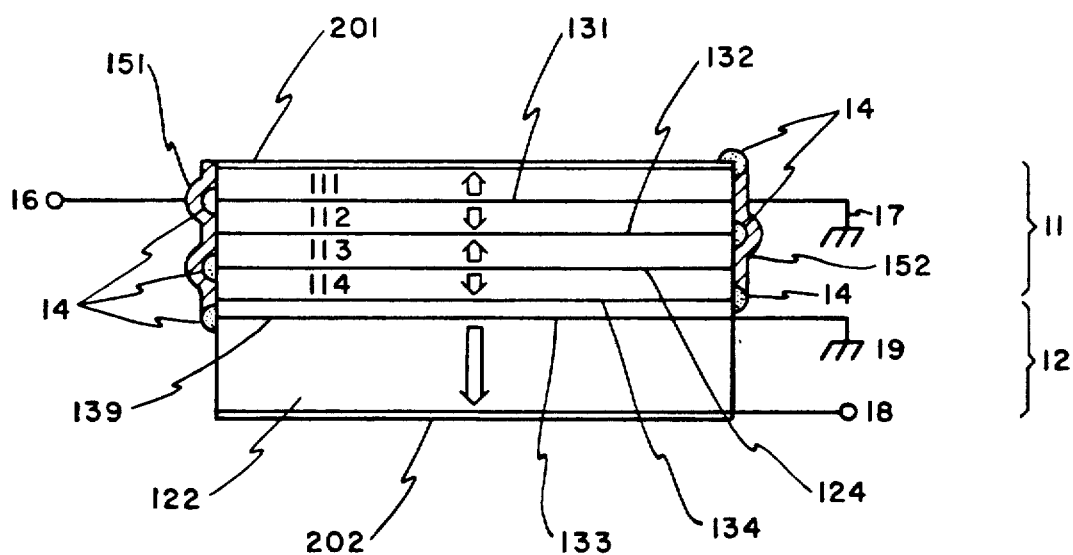
FIG. 4 is a cross-sectional view of an alternative embodiment of the piezoelectric transformer of FIG. 2 having a four-terminal construction.

The four-terminal construction shown in FIG. 4 comprises under the lowest internal electrode 134, an additional internal electrode 139 exclusively for the high impedance vibrator portion 12 electrically isolated from the other internal electrodes and connected to a fourth external terminal 19. When the fourth external terminal 19 is ground, the second external terminal 17 connected to internal electrodes 131 and 133 is also grounded. The layer 124 between the internal electrodes 134 and 139 is not necessary to be a piezoelectric layer. It is better to use an isolative layer for the layer 124. If piezoelectric layer is used for the layer 124, it is better not to be polarized. Although the electrodes 131 and 133 are connected to the grounded terminal 17 in FIG. 4, the electrodes 131 and 133 may be connected to the first external terminal 16, and electrodes 201, 132 and 134 to the grounded terminal 17 as shown in FIG. 3.

Figure 5:
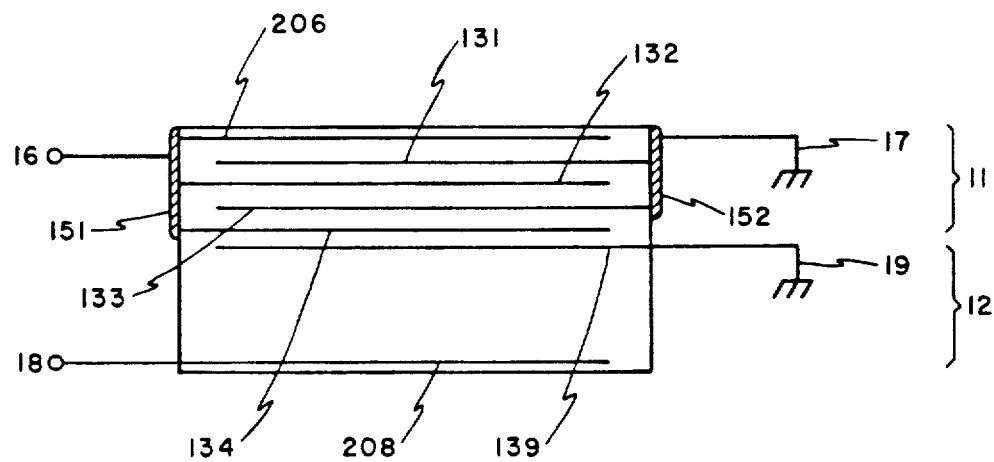
FIG. 5 is a cross-sectional view of a modification of the construction of FIG. 4 provided with intermediate electrodes arranged interdigitally.

In these embodiments, intermediate electrodes are exposed at their lateral ends of the piezoelectric transformer, and thus needs the side insulator layers 14. These side insulator layers can be neglected by adopting interdigital electrode structure as shown in FIG. 5, in which electrodes 206, 132, 134 and 208 is not exposed at one side surface of the piezoelectric transformer while electrodes 131, 133 and 139 are not exposed at the other side surface of the piezoelectric transformer. Internal electrodes 206, 132 and 134 are connected through a side conductor layer 151 to the external terminal 16. Internal electrodes 131, 133 are connected through a side conductor 152 to the external terminal 17. An internal electrode 208 is connected to the third external terminal 18, and the internal electrode 139 to the fourth external terminal 19. The electrodes 206 and 208 may be provided top and bottom surfaces of the transformer, respectively.

Further construction of piezoelectric transformer according to the invention, as stated above, comprises an insulator layer between the low impedance vibrator portion 11 and the high impedance vibrator portion 12. In such an embodiment shown in FIG. 6, there is provided integrally with each other a low dielectric constant insulator plate 140 of $Al_2O_3$, glass, or the like, between internal electrodes 134 and 139. The piezoelectric ceramic layers are subjected to polarization by application of a DC high electric field to be provided with piezoelectricity. Polarization, as indicated by arrows shown, is in the direction of thickness in all the piezoelectric layers, the adjoining layers being opposite in direction of polarization to each other.

It is a matter of course that also the piezoelectric transformer of this construction can be excited in both $\lambda/2$ and $\lambda$ thickness-extensional resonance mode.

By application of $\lambda$ mode resonance, the boundaries between the insulator plate 140 and the low and high impedance vibrator portions 11, 12 fall substantially on loop of vibration, thus undergo small vibration stress. For higher efficiency excitation in $\lambda$ thickness-extensional resonance mode, it is necessary that the thickness of the insulator plate 140 is smaller than 20% of that of the piezoelectric transformer. Single-peak thickness-extensional mode resonance without spurious can be realized beneficially by $\lambda$ mode excitation compared with by $\lambda/2$ mode excitation.

Figure 6:
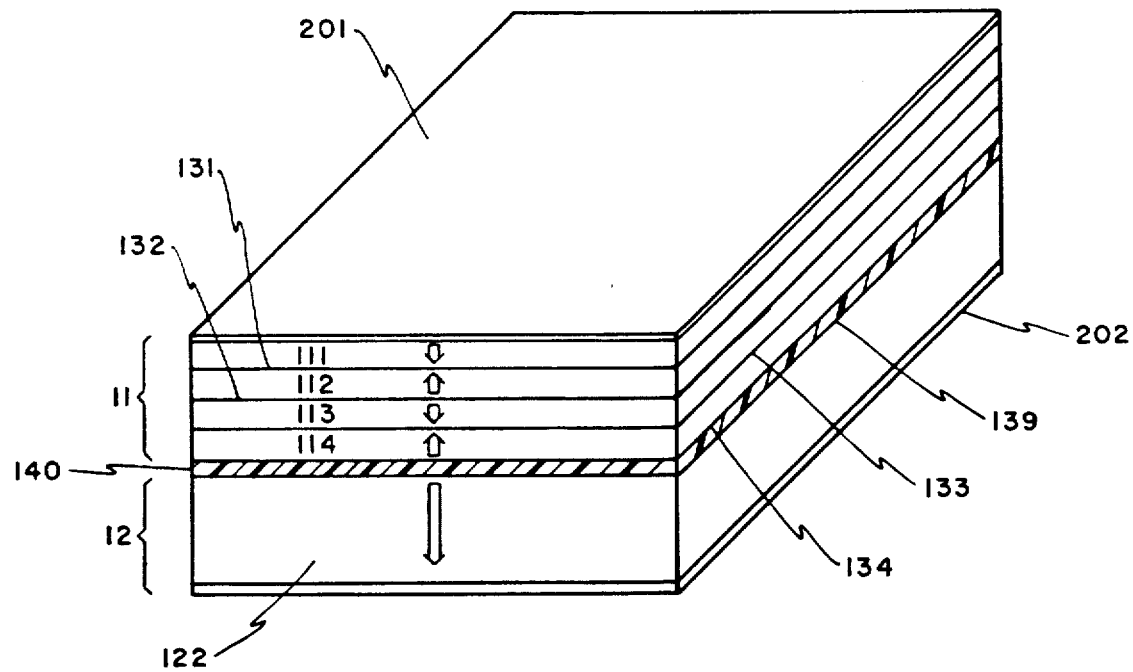
FIG. 6 is a perspective view of a stack of piezoelectric ceramics used in a piezoelectric transformer embodying the second basic construction of the invention.
Figure 7:
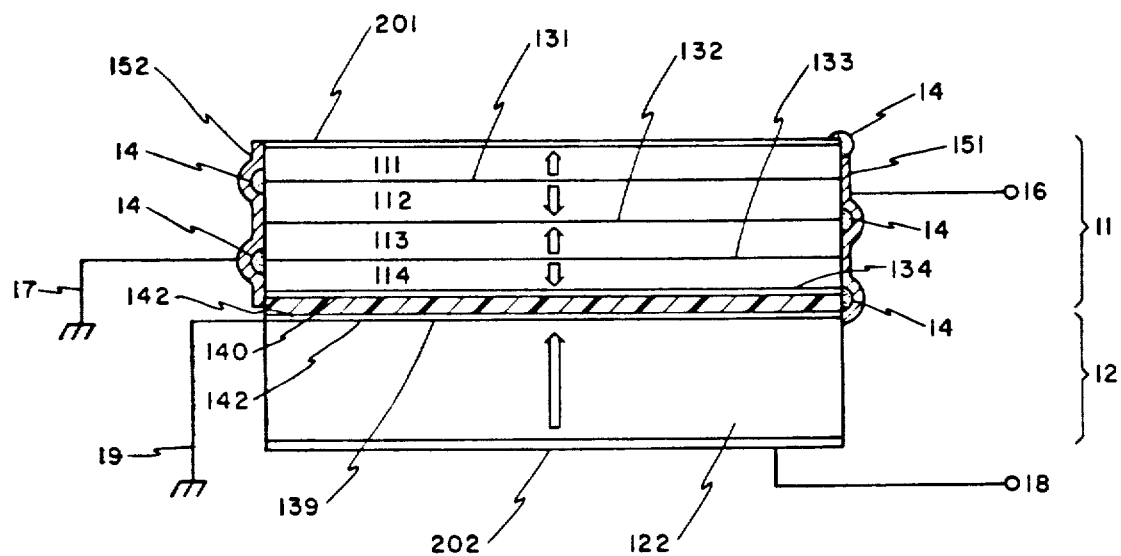
FIG. 7 is a cross-sectional view of an embodiment of the piezoelectric transformer of FIG. 6 having a four-terminal construction.
Figure 8:
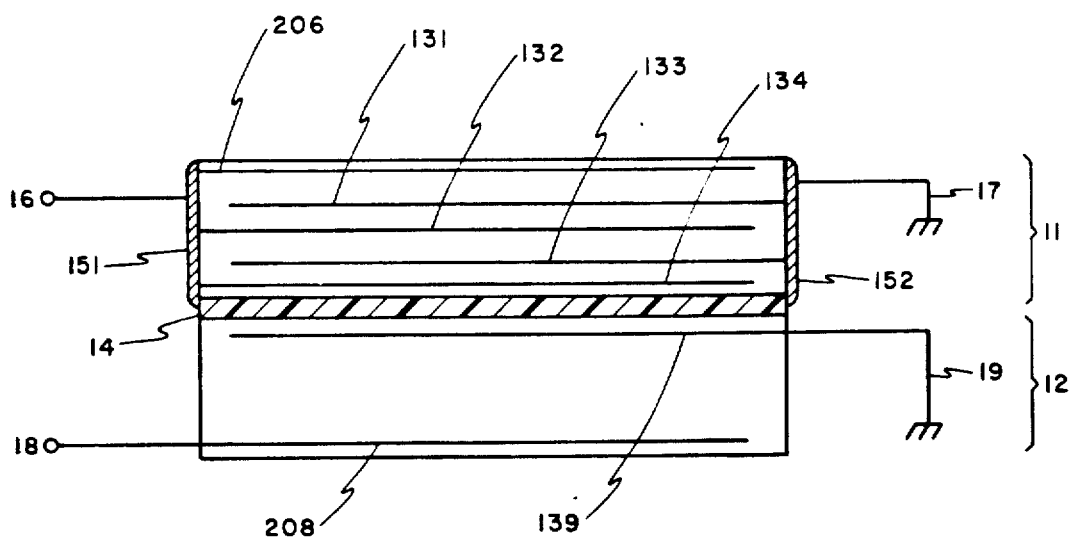
FIG. 8 is a cross-sectional view of a modification of the construction of FIG. 7 provided with intermediate electrodes arranged interdigitally.

The piezoelectric transformer shown in FIG. 6 may be of three- or four-terminal construction. Interposition of an insulator plate between piezoelectric ceramic elements makes greater the insulation resistance between input and output terminals and thus is advantageous particularly in four-terminal construction. As shown in FIG. 7, an insulator plate 140 is disposed through intermediation of bonding layers 142, 144. Internal electrodes 131, 133 are connected through the side conductor layer 151 to the first external terminal 16. Electrodes 201, 132 and 134 are connected through the side conductor layer 152 to the second external terminal 17. Electrode 202 is connected to the third external terminal 18 and electrode 139 to the fourth external terminal 19. Electrodes 131 through 134 and 139 shown in FIG. 7 are exposed at the sides of the piezoelectric transformer, and hence the side insulator layer 14 are necessary. Of course, it may be modified into interdigital electrode structure shown in FIG. 8 without needing side insulator layers 14. Electrodes 206, 132 and 134 are connected through the side conductor layer 151 to the first external terminal 16. Electrodes 131, 133 are connected to the second external terminal 17 through the side conductor layer 152. Electrodes 208 and 139 in the high impedance vibrator portion 12 are connected to the third and fourth external terminals 18 and 19, respectively.

Figure 9:
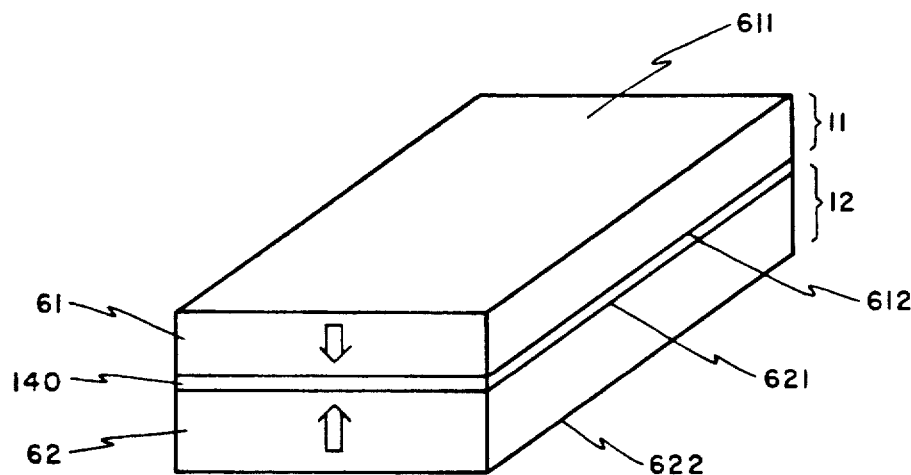
FIG. 9 is a perspective view of a piezoelectric transformer for explaining the third basic construction of the invention.

In the embodiments hereinbefore have been described on the assumption that piezoelectric layers in the low and high impedance portions 11, 12 are made of the same material but this is not always necessary. In particular, for the multi-layered structure of the low impedance portion 11, the number of layers can be reduced by making the piezoelectric material of it higher in dielectric constant than that of the high impedance portion 12. FIG. 9 shows an embodiment of piezoelectric transformer comprising low and high impedance portions 11, 12 of which structure is a single layer, respectively. The third embodiment of piezoelectric transformer according to the invention of this type consists, as laminated construction, of a low impedance vibrator portion 11 including a pair of electrodes 611 and 612 and a high dielectric constant piezoelectric ceramic layer 61 between them, and a high impedance vibrator portion 12, and operates in thickness-extensional mode of vibration. The direction of polarization is in the thickness, as indicated by arrows. The piezoelectric transformer like this, to the fabrication of which a process consisting of laminating green sheets made of two kinds of piezoelectric materials different in dielectric constant, removing the binder, and burning is applied, can be fabricated in small size to large size with relative easiness. Methods of bonding two piezoelectric ceramics are known. Thus even though $\kappa/2$ mode (both ends-free fundamental mode) or $\kappa$ mode (both ends-free second mode) thickness-extensional resonance is used, a piezoelectric ceramic transformer operating in the ultrasonic range covering a 5 to 10 MHz band can be realized.

Figure 10:
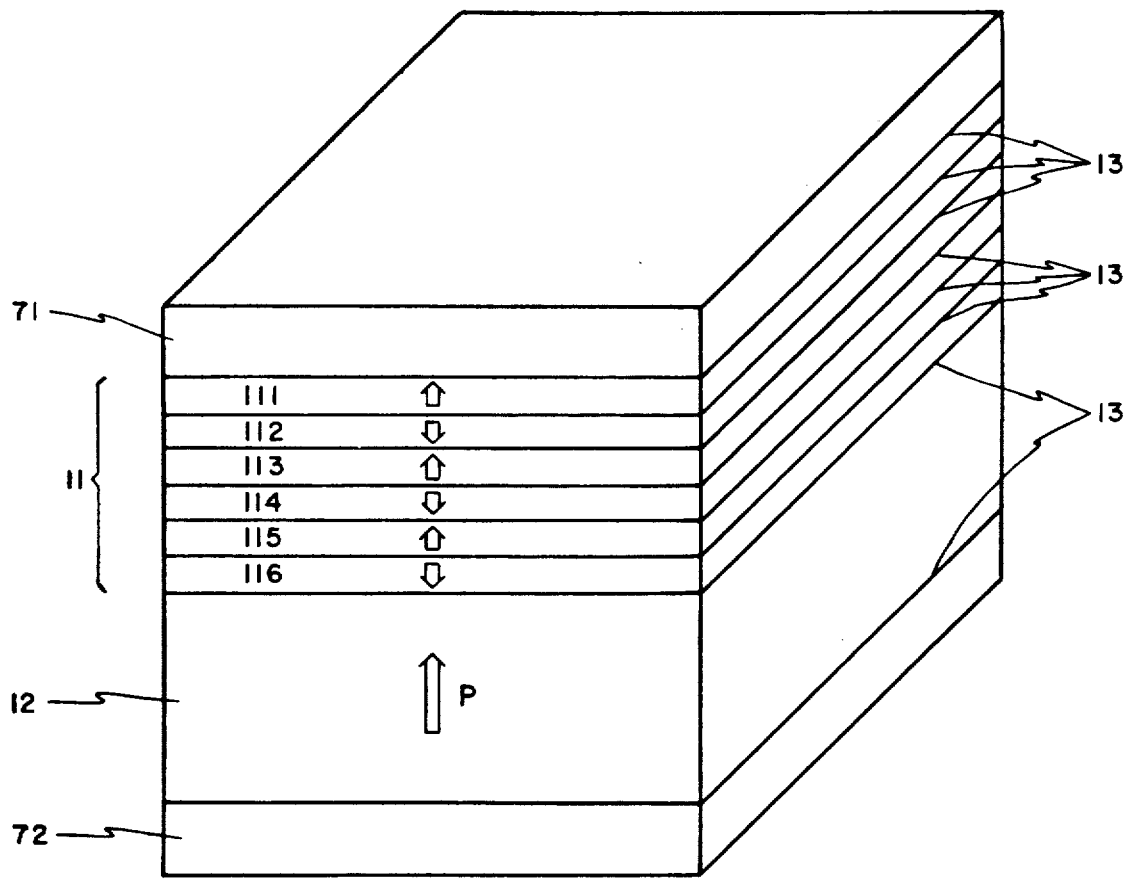
FIG. 10 is a perspective view of a stack of piezoelectric ceramics used in a piezoelectric transformer embodying the fourth basic construction of the invention.

As shown in FIG. 10, a fourth embodiment of piezoelectric transformer according to the present invention shown in FIG. 7 is an integrally laminated construction composed of a low impedance portion 11 consisting of a number of superposed piezoelectric ceramic plates polarized in the direction of thickness, a high impedance portion 12 consisting of a single layer or up to a few layers of piezoelectric ceramic plate, frequency adjusting ceramic layers 71, 72 formed at the top and bottom of the construction. The piezoelectric layers 111 through 116 are arranged so that the adjacent layers are polarized in opposite directions, and internal electrode layers 13 are interposed between piezoelectric layers thereby electric field can be applied to each piezoelectric layer in the direction of thickness.

The resonant frequency of the piezoelectric ceramic transformer is not always as designed but varies due to dispersion in shrinkage during sintering process. A construction therefore is desirable which permits resonant frequency to be adjusted after the sintering. Since a piezoelectric transformer has electrodes on the top and bottom faces, respectively, it is difficult to adjust the resonant frequency after the sintering. The piezoelectric transformer of this construction comprising the layers 71, 72 capable of being ground for adjusting frequency, can be adjusted by lapping after the sintering to a desired resonant frequency which thus can be exactly in accordance with the drive frequency of the external circuit.

From the viewpoint of the efficiency, piezoelectric transformers are accompanied by losses of which the major part is mechanical loss. This mechanical loss is greater with smaller mechanical quality coefficient $Q_m$ which depends on parallel precision and planeness of the top and bottom main faces. The surfaces of the piezoelectric transformer burned and remaining as it is are bad both in parallel precision and in planeness, and their mechanical coefficient $Q_m$ is up to a few of 100's. On the other hand, the piezoelectric transformer according to the present invention can be ground to improve the parallel precision and planeness to values of up to several μm, and hence $Q_m$'s of 1000 or more can be easily attained.

EXAMPLE 1

Figure 11:
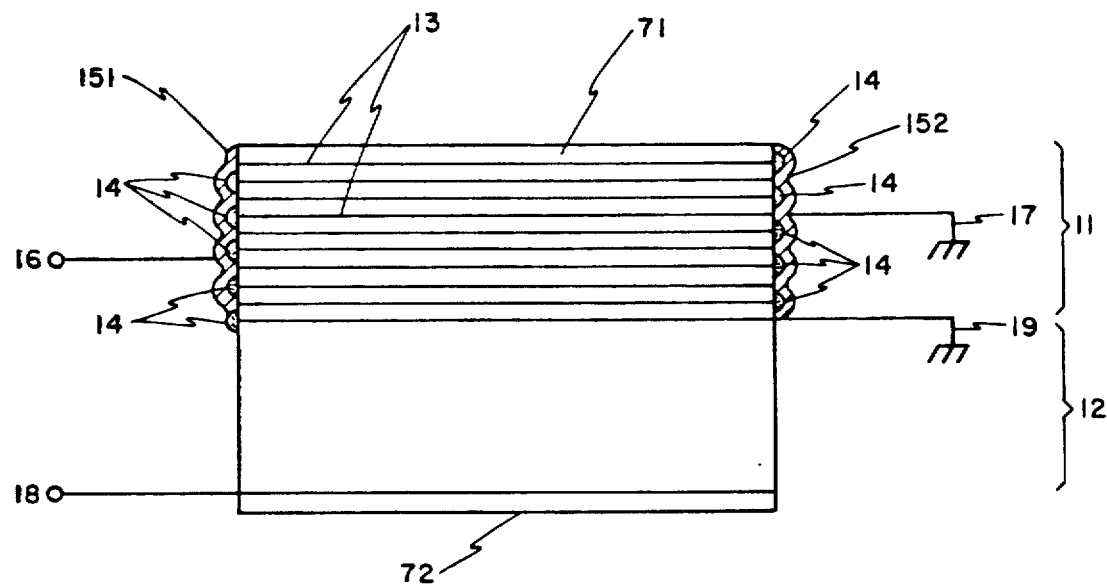
FIG. 11 is a cross-sectional view of an embodiment of the piezoelectric transformer of FIG. 10 having a four-terminal construction.

A 2-MHz band, four-terminal piezoelectric transformer according to the invention of thickness-extensional second (λ) mode which comprises a plurality of internal electrodes, shown in FIG. 11, was made for test by the later-described laminate ceramic technque. As piezoelectric ceramic material was used $PbTiO_3$ piezoelectric ceramics (Trade name: NEPEC-200; by Tokin Co., Ltd.). This piezoelectric transformer was constructed to step down high frequency voltage input through terminals 18, 19 and to output this step-down high frequency voltage through terminals 16, 17. It had dimensions of width 3.5 mm, length 4.5 mm and thickness (height) 1.98 mm. The high impedance portion 12 had a thickness of 1.08 mm which is about a half of the overall thickness. The low impedance portion 11 was of multi-layered structure consisting of nine electrode layers and eight piezoelectric layers so that electrode layers and piezoelectric layers were laminated alternately, thus each piezoelectric layer was interposed between electrodes. The adjacent piezoelectric layers were polarized in opposite directions by application of high DC voltage between the electric terminals. The piezoelectric transformer of this Example comprised a frequency adjusting layer 71 or 72, material of which was the same as that of other piezoelectric layers, at the top and bottom thereof, respectively. The piezoelectric transformer of this Example was constructed in the same way in the others as in FIG. 4, and hence the corresponding parts or components were designated at the same reference characters, the description of them being omitted.

Figure 12:
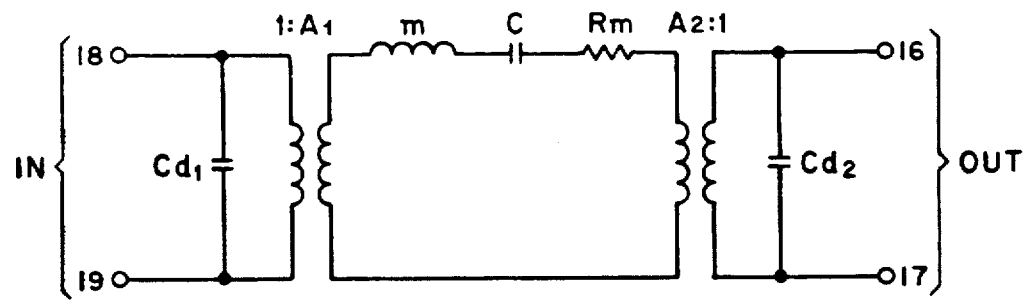
FIG. 12 is a lumped-constant approximate equivalent circuit of the piezoelectric transformer of FIG. 11.
Figure 13:
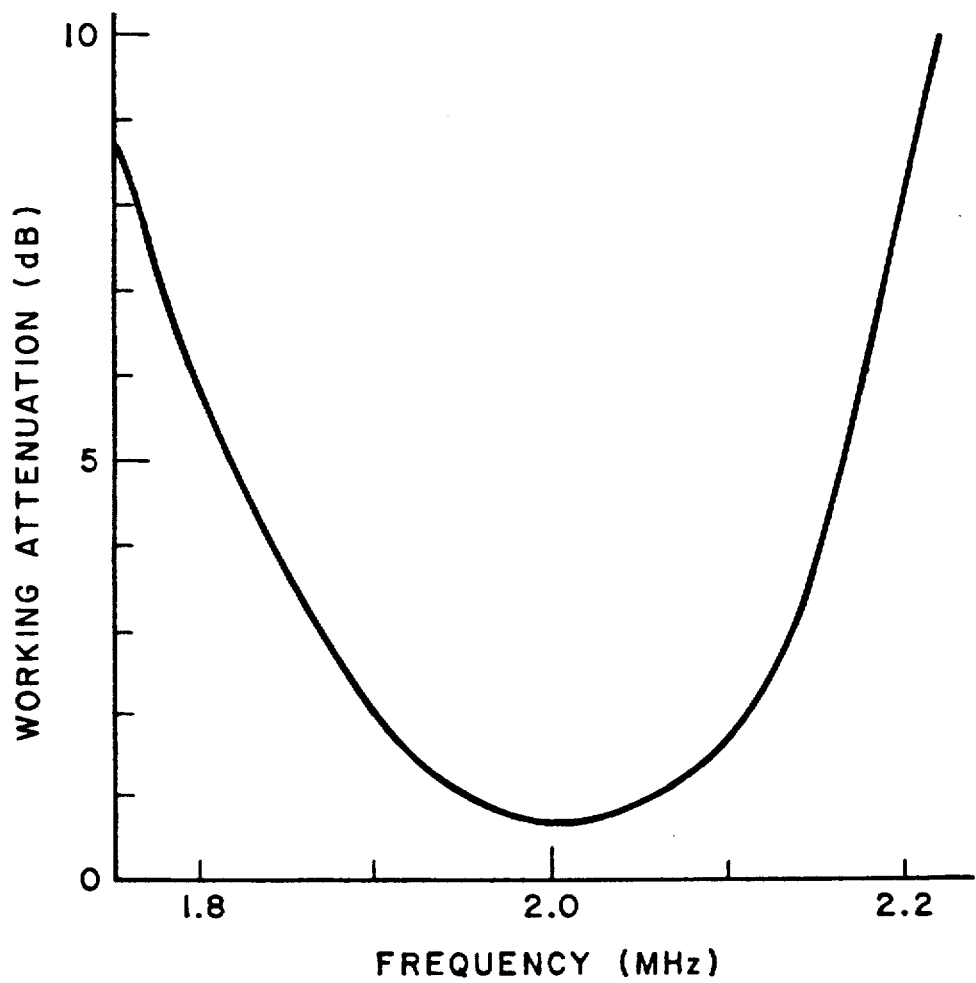
FIG. 13 is a graph showing the attenuation characteristic of the piezoelectric transformer of FIG. 11.
Figure 14:
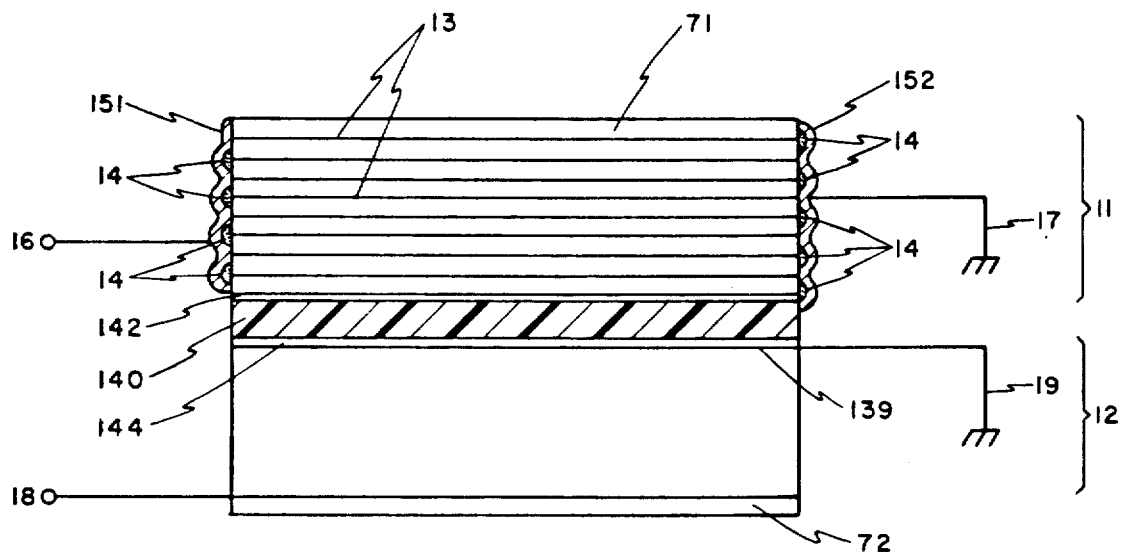
FIG. 14 is a cross-sectional view illustrative in detail of the piezoelectric transformer of FIG. 7.

The lumped constant approximate equivalent circuit of the piezoelectric transformer of this Example is given in FIG. 12, in which $C_{d1}$ and $C_{d2}$ are damped capacitance at the input and output, respectively, $A_1$ and $A_2$ are force factors, m, C and Rm are equivalent mass, equivalent compliance and equivalent mechanical resistance. The piezoelectric transformer was designed as a Butterworth primary filter based on the equivalent circuit shown in FIG. 12. The subsequent Examples are similar. FIG. 13 gives a working attenuation characteristic in measured value when terminating with a suitable resistance load at the input and output parts of the transformer. Attenuation at a center frequency of 2 MHz was not more than 1 dB, and 3 dB ratio band width was within 15% of the center frequency. For voltage transmission, application of AC 50 V resulted in a stable output of 5 V.

It is a matter of course that the transformer can be operated also in basic thickness-extensional vibration mode, if desired, assuming a drive frequency as 1 MHz.

Additionally, for the piezoelectric transformer in this Example was used a $PbTiO_3$ family piezoelectric ceramic material of enough smaller coupling coefficient $k_{31}$ of transverse-effect/longitudinal vibration mode which could cause spurious vibration compared with thickness-extensional coupling coefficient $K_t$. Lead titanate zirconate, piezoelectric ceramic material however has a considerably greater $k_{31}$ ranging ⅓ to ½ of $k_t$ than $PbTiO_3$ piezoelectric ceramic material. Thus it is a matter of course that if the width and length are set so as to cause spurious frequency due to $k_{31}$ to be sufficiently far away from thickness-extensional resonant frequency a piezoelectric transformer having t/1 resonance characteristic can be realized.

Besides instead of the above-mentioned construction that the terminals of the low impedance portion and terminals of high impedance portion are located in the same plane, they may be located on different planes as shown in FIG. 3 and in Example 7.

EXAMPLE 2

Figure 15:
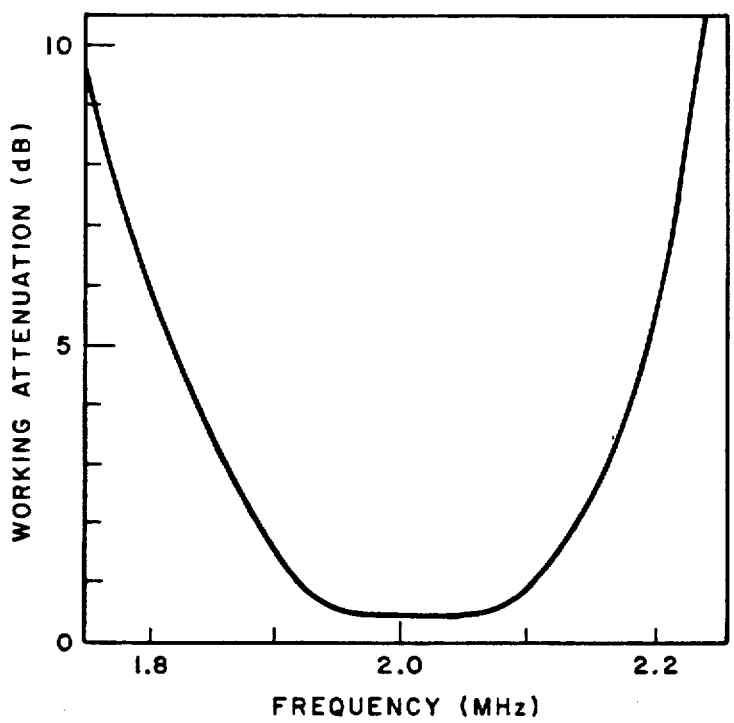
FIG. 15 is a graph showing the attenuation characteristic of the piezoelectric transformer of FIG. 14.

A 2-MHz band, four-terminal piezoelectric transformer of thickness-extensional second (λ) mode as shown in FIG. 4 was made for test by the laminate ceramic technique. This Example is substantially the same as that shown in FIG. 7 except the number of laminated layers and frequency adjusting layers 71, 72, and hence the corresponding parts or components are designated at the same reference characters, the description of them being omitted. As piezoelectric ceramic material was used a $PbTiO_3$ piezoelectric ceramic (Trade name: NEPEC-200; by Tokin Co., Ltd.). Alumina ceramic plates of 0.2 mm thick was used as insulator plate 140, and adhered firmly to the low and high impedance layers 11, 12, respectively, through the intermediation of epoxy adhesive layers 142, 144. This peizoelectric transformer was constructed to step down high frequency voltage, which accorded with the thickness-extensional second mode resonant frequency, input through terminals 16, 17 and to output the step-down high frequency voltage through terminals 18, 19. It has dimensions of thickness 2.3 mm, width 3.6 mm and length 5.3 mm. The low impedance portion 11 was of multi-layered structure consisting of nine internal electrode layers 13 and eight piezoelectric ceramic layers so that electrode layers and piezoelectric layers are laminated alternately, thus each piezoelectric layer is interposed between electrodes. The adjacent piezoelectric layers were polarized in opposite directions by application of high DC voltage between electric terminals 16, 17. FIG. 15 gives a working attenuation characteristic in measured value when terminating with a suitable resistance load at the input and output parts of the transformer. Attenuation at a center frequency of 2 MHz was not more than 0.6 dB, and 3 dB ratio band width was 15%. For voltage transmission, application of sine wave of 50 V resulted in a stable output 4.8 V.

Additionally, for the piezoelectric transformer used in this Example was used a $PbTiO_3$ type piezoelectric ceramic material of enough (about 1/10) smaller coupling coefficient $k_{31}$ of transverse-effect/longitudinal vibration mode which can cause spurious vibration compared with thickness-extensional coupling coefficient $K_t$. Lead titanate zirconate ceramic piezoelectric material however has a considerably greater $k_{31}$ ranging $\frac{1}{3}$ to $\frac{1}{2}$ of $k_t$ than $PbTiO_3$ piezoelectric ceramic material. Thus it is necessary to set the width and length so as to cause spurious frequency due to $k_{31}$ to be sufficiently far away from thickness-extensional resonant frequency.

EXAMPLE 3

Figure 16A:
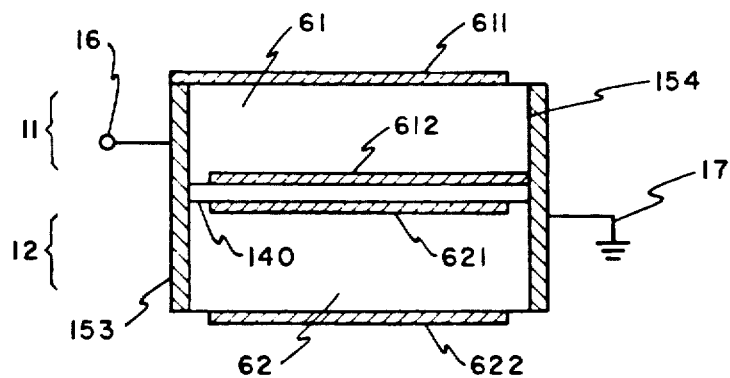
FIGS. 16A and 16B are cross-sectional views of the piezoelectric transformer of FIG. 9 perpendicular to each other.
Figure 16B:
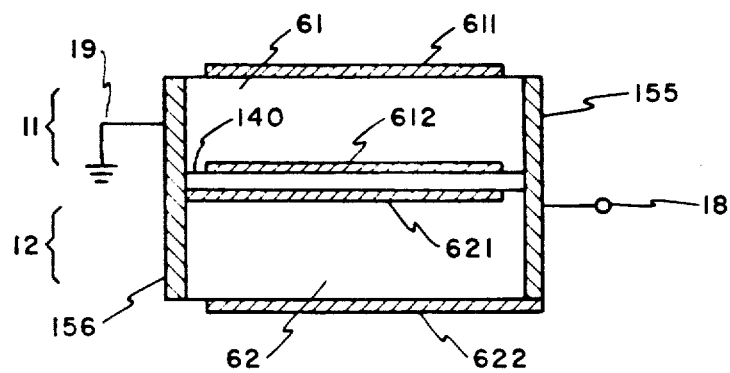
Figure 17:
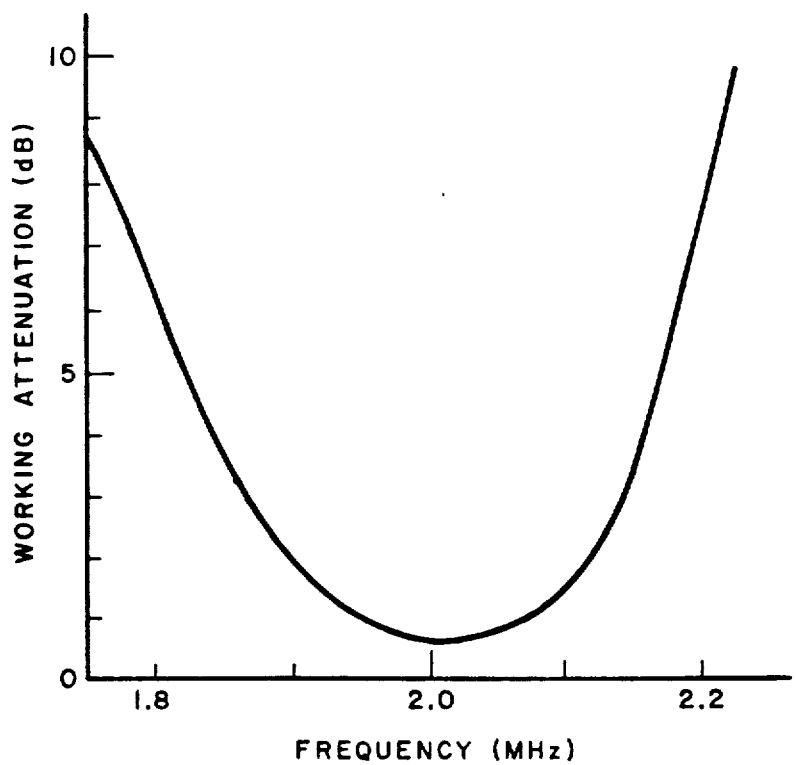
FIG. 17 is a graph showing the attenuation characteristic of the piezoelectric transformer of FIG. 16.

In FIGS. 16(a) and 16(b) is illustrated a four-terminal piezoelectric transformer in which the conductors disposed perpendicularly to each other are connected to the terminals as a modified example of the piezoelectric transformer shown in FIG. 9. To this, 2 MHz band, thickness-extensional second mode was applied. $PbTiO_3$ piezoelectric material was used as low dielectric constant piezoelectric material of the high impedance portion 12, and lead titanate zirconate ceramic piezoelectric material for high dielectric constant piezoelectric material of the low impedance portion 11. This Example is constructed to set down high frequency voltage applied between terminals 18, 19 connected to side conductor layers 155, 156 and to output the set-down high frequency voltage through terminals 16, 17. It has dimensions of width 4 mm, length 5 mm and thickness 2.3 mm. The low impedance portion 11 had a thickness of 1.0 mm and the high impedance portion 12 had a thickness of 1.3 mm. There were provided drive electrodes 611 to 622 in each impedance portion, which were adhered through the intermediation of lead glass layer 140. In this Example, terminals 16, 17 were connected to drive electrodes 611, 612, respectively, of the low impedance portion 11, and terminals 18, 19 were connected to drive electrodes 622, 621, respectively, of the high impedance portion 12. Side conductor layers 153 to 156 are provided in respective different planes as shown. FIG. 17 gives a working attenuation characteristic in measured value when terminating with a suitable resistance load at input and output of the transformer. Attenuation at the center frequency was not more than 1 dB, and 3 dB ratio band width was 15%. For voltage transmission, application of AC 50 V resulted in a stable output of 5 V.

It also is of course that for the piezoelectric transformer, fundamental thickness-extensional vibration mode can be used by taking the drive frequency as 1 MHz.

In the following, the process of fabricating according to the present invention will be described by way of an example where a piezoelectric ceramic transformer shown in FIG. 16 is made. The process is composed essentially of making piezoelectric ceramics in first step and then adhering these to each other. A $PbTiO_3$ piezoelectric ceramic 62 having a low dielectric constant was made by weighing main gradients, PbO and $TiO_2$, and very small amounts of impurities, placing them together with water as a dispersing medium in a ball mill pot, and then mixing for about 40 hours. The resultant mixture was filtered, dried, calcined at 900° C. for 4 hours in an electric furnace, and ground in a mortar for 20 minutes. Subsequently a very small amount of an aqueous solution of polyvinyl alcohol was added, and molded by means of a press. Additional calculation in an electric furnace was carried out at 1300° C. for 2 hours. Thus a low dielectric constant piezoelectric ceramic was made. After cutting into a desired shape by a cutter and then grinding, the top and bottom surfaces were coated with a conductive paste made of silver-glass frit, followed by baking at about 700° C. Thus drive electrodes 621, 622 was obtained.

Lead titanate zirconate piezoelectric ceramic 611 which is a high dielectric piezoelectric ceramic was made as follows: PbO, $ZrO_2$ and $TiO_2$) as main components, and very small amounts of impurities were weighed, placed, along with water as a dispersion medium, in a ball mill pot and mixed for 40 hours, proceeding in substantially the same way as in making the $PbTiO_3$ piezoelectric ceramic. The low dielectric constant ceramic 62 and high dielectric constant ceramic 61 obtained in the above-stated way were coated on their opposed surfaces with a glass paste consisting of a lead glass, ethyl cellulose and a solvent to a thickness of about 15 μm by the screen printing technique, adhered together, and heated at 650° C. for 30 minutes. The thus-obtained integrated product composed of the ceramics 61, 62 having low and high dielectric constants, respectively, was then coated on the side surfaces with a silver paste consisting of silver and glass frit by the screen printing technique, and baked at about 500° C. to form side conductor layers 153, 154, 155 and 156. The resultant was kept at 100° C. in silicon oil, and DC voltage of 5 kV was applied between the side conductor layers 153 and 154, and between side conductor layers 155 and 156 to polarize the piezoelectric ceramics 61, 62. In this way, a piezoelectric ceramic transformer was obtained. If polarization directions of the low and high dielectric constant piezoelectric ceramics 61, 62 are the same, then the polarities of the side conductor layers 155, 156 in FIG. 16 become changed, and hence it is preferred that for attaining higher breakdown voltage between the external conductor layers 154 and 156, a thin plate as of $Al_2O_3$ is provided between the low impedance portion 11 and the high impedance portion 12.

Another process for fabricating according to the present invention will be described under. In the first step for making green sheets as low dielectric constant piezoelectric material, the above-mentioned calculated powder of $PbTiO_3$ piezoelectric ceramic (about 80% by weight), polyvinyl alcohol (about 10% by weight) as a binder, glycerin as a plasticizer, and water (about less than 10% by weight) as a solvent, each being measured in the desired amount, and mixed by means of an agitator. The solvent was suitably added so that the mixture or the so-called slurry became a viscosity of approximately 5,000 cp. The resultant slurry was molded into green sheets of about 130 μm in thickness by the slip casting technique. Then the sheets were punched by puncher into the shape appropriate for the lamination of them by a press provided with heater. Also drive electrodes to be used together with PbTiO$_3$ ceramic green sheets were made by conducting screen-printing of a platinum type paste comprised of calcined powder of Pt-PbTiO$_3$, binder and solvent.

On the other hand, green sheets to be used as high dielectric constant material were made from the above-mentioned calcined lead zirconate titanate (PZT) piezoelectric ceramic powder in the same way as in making green sheets of PbTiO$_3$ piezoelectric material. Drive electrodes for the PZT green sheets are made by conducting the screen printing of a Pt-type paste comprising Pt-PZT ceramic powder, binder and solvent. In an example, one sheet of PbTiO$_3$ piezoelectric green sheet including the drive electrode 622 printed thereon, twelve sheets of PbTiO$_3$ piezoelectric green sheets, one sheet of PbTiO$_3$ piezoelectric green sheet including the drive electrode 621 printed thereon, one sheet of PZT piezoelectric green sheet, one sheet of PZT piezoelectric green sheet including the drive electrode 612 printed thereon, eight sheets of PZT piezoelectric green sheets, and one sheet of PZT piezoelectric green sheet including the drive electrode 611 printed thereon were superposed in turn, placed in a press mold, and compressed under heat into an integrated laminate therein. The resultant green laminate was heat-treated at 500° C. in air for ten hours to expel the binder. Then after burning at 1300° C. for two hours, it was cut into desired dimensions. Subsequently a silver paste consisting of silver glass frit, binder and solvent was printed on the four sides of the laminate, and baked at 500 C. to form side conductor layers 153 through 156 shown in FIG. 16. After external terminals 16 through 19 were formed, the piezoelectric layers were polarized. In this way was obtained a piezoelectric transformer including a layer of solid solution comprising PbTiO$_3$ and PZT between the low and high impedance portions 11 and 12. The first-described process of fabricating a piezoelectric ceramic transformer in which piezoelectric ceramics were made and then drive electrodes 611, 612, 621, 622 and side conductor layers 153 through 156 were formed, has advantage to allow inexpensive metal such as Ag or Cu to be used as material for electrodes and terminals. The second-described fabricating process is advantageous in being not only simple but also useful for mass production. These processes are applicable to other constructions.

EXAMPLE 4

In piezoelectric ceramic transformer, spurious vibration occurs in directions of length and width. It therefore is necessary for the realization of a side band piezoelectric transformer to keep spurious intense vibration from occurring in directions of length and width near the drive frequency.

Assuming that sonic velocities in directions of thickness and width are the same and width-to-thickness ratio $w \leq 0.8$ t, then the resonant frequency in the thickness-direction primary mode is 25% higher than that in the fundamental thickness-extensional vibration mode. Besides in piezoelectric ceramics, the round velocity is approximately 10% higher in direction of thickness than in directions of width and length. Also taking this into consideration, any spurious vibration near the resonant frequency of the thickness-extensional vibration for which vibration in direction of width is responsible, does not appear.

Taking length-to-thickness ratio as 5.5 or more, the frequencies of the primary through guintic harmonic over-tone modes in direction of length are lower than the resonant frequency of the fundamental thickness-extensional mode, and spurious vibration in respect with thickness-extensional vibration can occur only in sextic or higher harmonic over-tone modes. Generally, magnitude of the response of resonance gets smaller with higher degree, and accordingly the sextic or higher degree modes can negligibly affect lower degree modes of thickness-extensional vibration. Besides elongation of piezoelectric ceramic transformer can reflect much increase in output.

Figure 18:
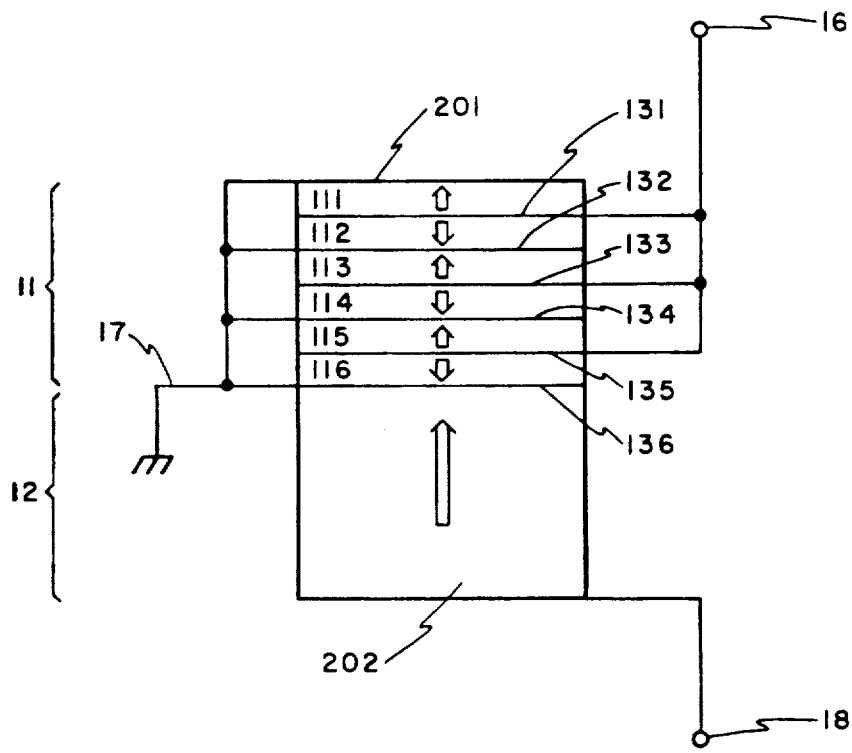
FIG. 18 is a schematic diagram for illustrating in detail the three-terminal piezoelectric transformer of FIG. 3.

In this Example, a piezoelectric ceramic transformer according to the present invention constructed as illustrated in FIG. 18 was made by the green sheet technique. An suitable material for piezoelectric ceramic was PZT piezoelectric ceramic. The low impedance portion 11 comprised 6 piezoelectric ceramic layers each having a thickness of 0.1 mm. The high impedance portion 12 was 0.4 mm thick. On each piezoelectric ceramic was printed a platinum paste by screen-printing technique, respectively, and intergrally sintered, accompanied by the formation of intermediate electrodes of platinum 131 and 136. In this case, for avoiding deterioration of characteristics such as warping and dimensional dislocation associated with shrinkage resulting from sintering, the top and bottom piezoelectric ceramic 111 and 116 were layered about 0.05 mm thicker than intermediate layers 112 through 115, and ground following sintering, with #3000 abrasive to parallel precision and plane state. Then each of Au-Ti electrodes 201 and 202 was formed on the top and bottom surface, respectively, by the sputtering technique. Subsequently for polarization, high DC voltage was applied in directions indicated by arrows shown. This example was appreciated to be a step-down transformer so constructed that high frequency voltage signal exciting thickness-extensional primary mode input through terminals 18 and 17 of the high impedance portion 12 was stepped down and output through terminals 16 and 17 of the low impedance portion 11.

Figure 19:
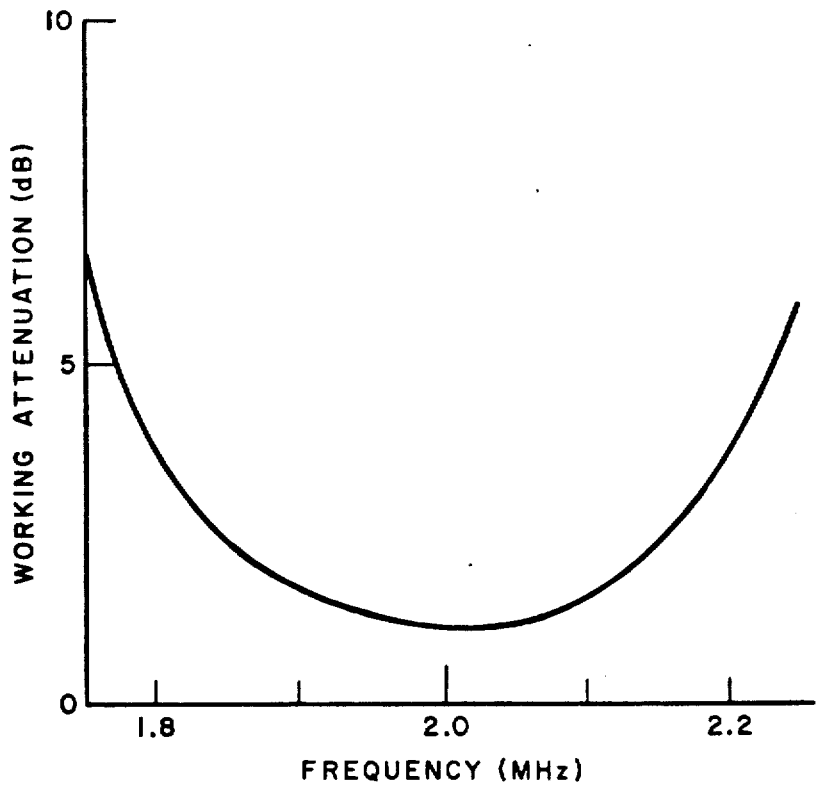
FIG. 19 is a graph showing the attenuation characteristic of the piezoelectric transformer of FIG. 18.

FIG. 19 gives a graph of a working attenuation characteristic based on the results measured with a piezoelectric ceramic transformer of 0.67 in width-to-thickness ratio and 7.3 in length-to-thickness ratio, with termination through a suitable resistance load. It shows a good characteristic of the attenuation of at the center frequency 1.2 dB and 3 dB-ratio band width within 18% of the center frequency. The voltage transmission was found to attain a stable voltage of 8.3 V or higher at an input voltage of 50 V.

Figure 20:
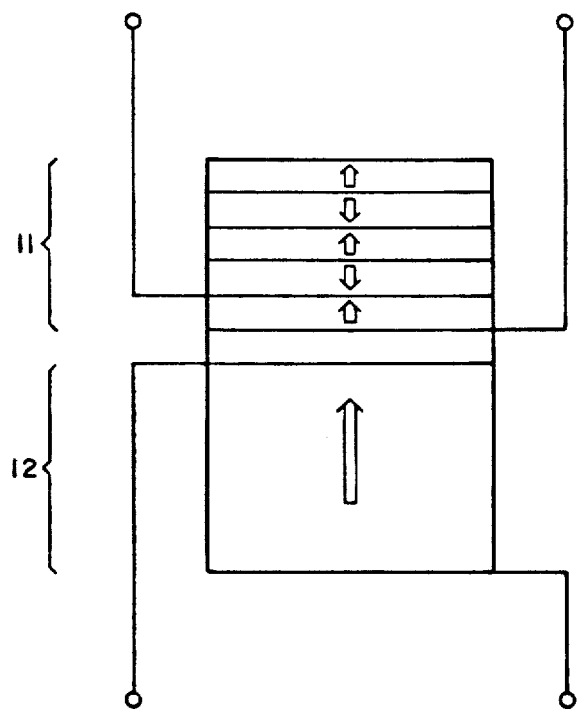
FIG. 20 is a schematic diagram for illustrating in detail the four-terminal piezoelectric transformer of FIG. 4.

With a four-terminal type shown schematically in FIG. 20 were obtained substantially the same results of within 12% of the center frequency in 3 dB-ratio band width and 9.1 V in output voltage.

Figure 21:
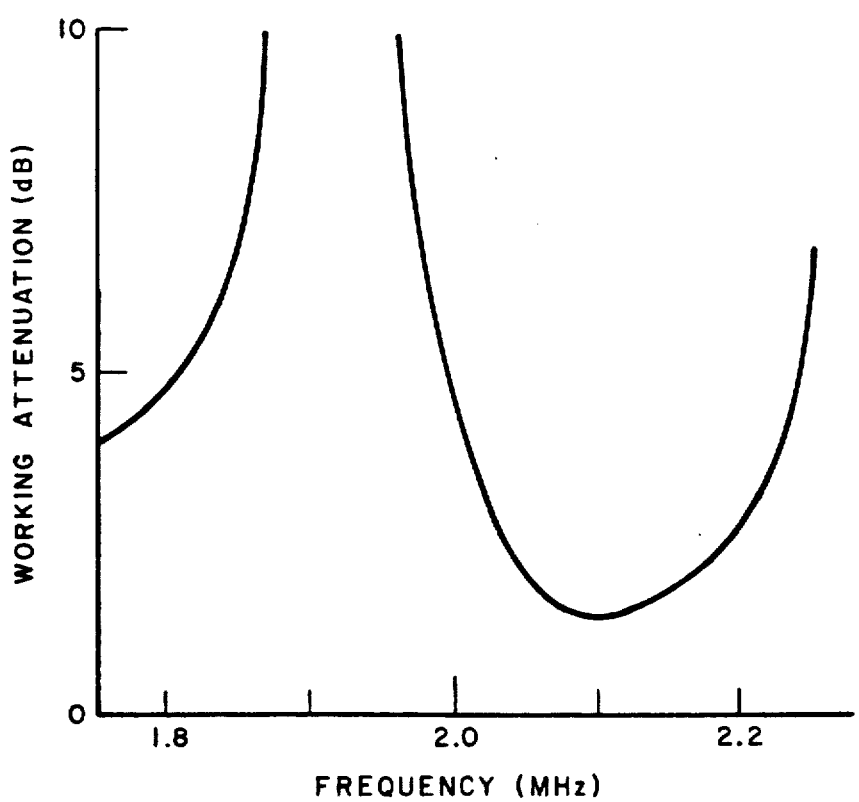
FIG. 21 is a graph showing the attenuation characteristic of the piezoelectric transformer of FIG. 20.

FIG. 21 gives a graph of a working attenuation characteristic in the case of taking a width-to-thickness ratio as 1.1. By the vibration in direction of width, the attenuation characteristic was affected with a great impairment at a range of 1.8 to 2.0 MHz, and as the result, increase to 1.6 dB in attenuation at the center frequency and decrease to 11% in 3 dB ratio band width.

On the other hand, taking a width-to-thickness ratio as less than 0.2, the entire strength of the piezoelectric ceramic transformer becomes smaller, and thus liable to undergo mechanical damage. For example, at a width-to-thickness of 0.15, damage occurred at a ratio of ⅜ or more within 5 minutes by resonance at a field intensity of 100 V/mm.

At length-to-thickness ratios, the maximum changes in 3 dB ratio band width were obtained, for example, 10% or more at smaller than a length to thickness ratio of 5.5 in the first instance and 3% or less at the ratio of 5.5 or more in the second instance.

EXAMPLE 5

Figure 22:
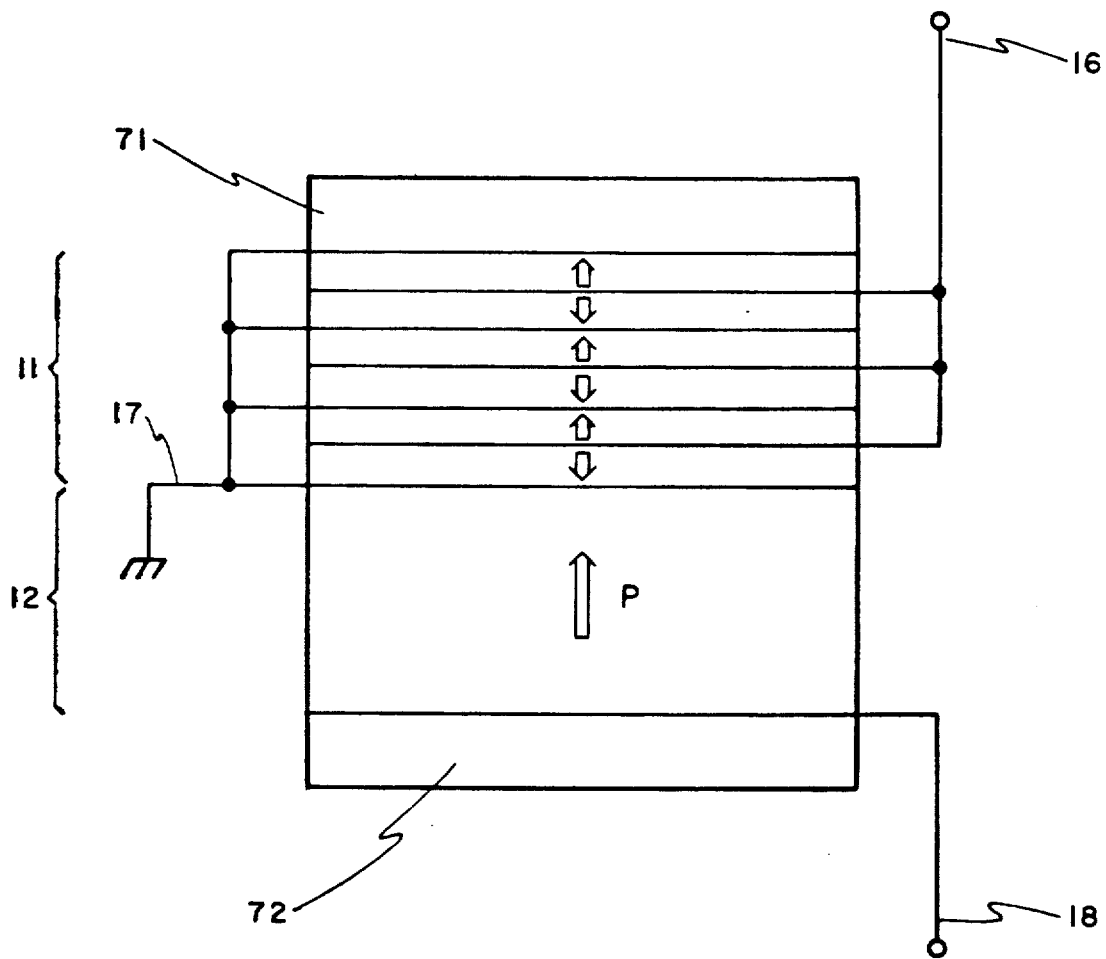
FIG. 22 is a schematic diagram for illustrating in detail the piezoelectric transformer of FIG. 10 having a three-terminal structure.

An Example of piezoelectric transformer comprising frequency adjusting layers schematically illustrated in FIG. 22 was made by the green sheet technique. It was made of PZT piezoelectric ceramic. The low impedance portion 11 was multi-layered structure consisting of 10 piezoelectric ceramic layers each having a thickness of about 0.15 mm. The high impedance portion 12 had a thickness of about 1.4 mm. The frequency adjusting layers 71, 72 were made of the same material and its thickness was about 0.4 mm, but of course may be made of other suitable material if it can be burned integrally with the low and high impedance portions. After screen-printing of Pt type paste, integral burning including piezoelectric ceramic layers was carried out, then Pt electrode layers being formed. Following sintering, parallel and plane lapping on the top and bottom surface, respectively, was made with #3000 abrasive. Subsequently polarization was made by application of high DC voltage. This example appreciated to be a voltage step-down transformer so constructed that high frequency and high voltage signal for oscillating or exciting the fundamental thickness-extensional mode input through terminals 18 and 17 of the high impedance portion 12 are step down and output through terminals 16 and 17 of the low impedance portion 11.

Figure 23:
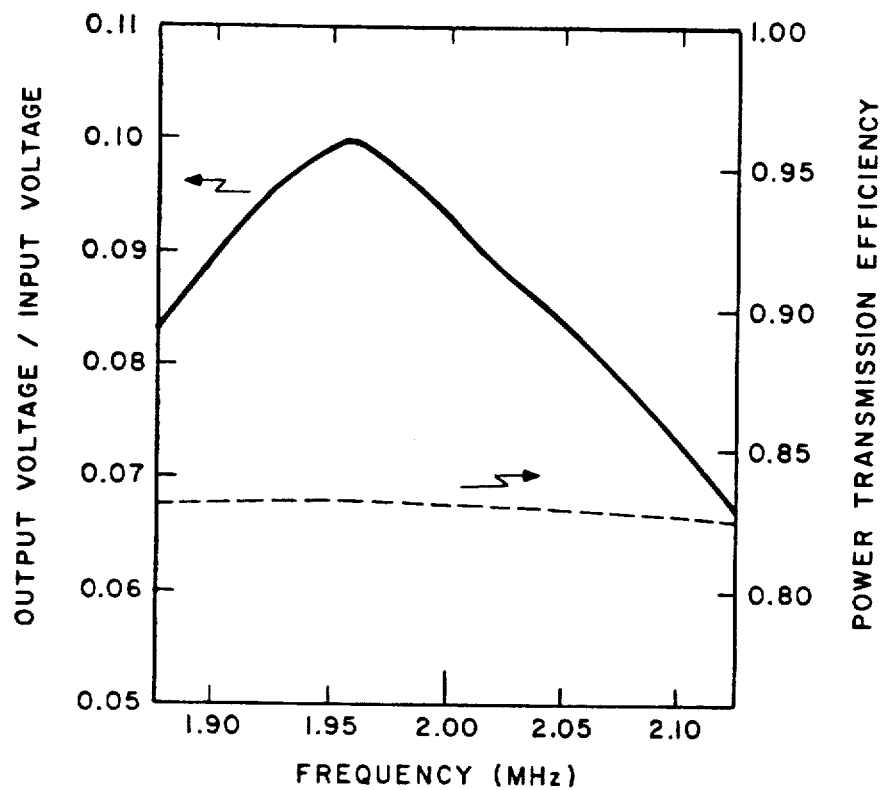
FIGS. 23 and 24 are graphs showing the frequency characteristics of the piezoelectric transformer of FIG. 22.
Figure 24:
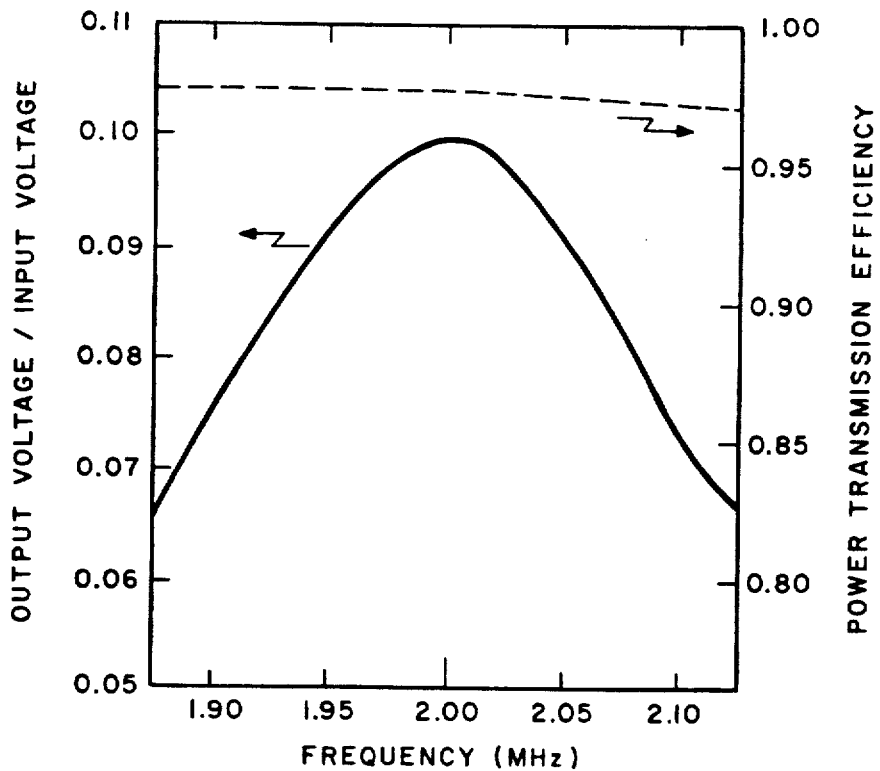

The frequency characteristic of the piezoelectric ceramic transformer sintered, but followed by no further processing, is shown in FIG. 23. The resonant frequency is 1.95 MHz, and the power transmission efficiency is as low as 83%. On the other hand, one of which the top and bottom surfaces subjected to the parallel and plane lapping showed the frequency characteristic plotted in FIG. 24, as of resonant frequency 2.00 MHz and a high power transmission efficiency as high as 97% or more.

Figure 25:
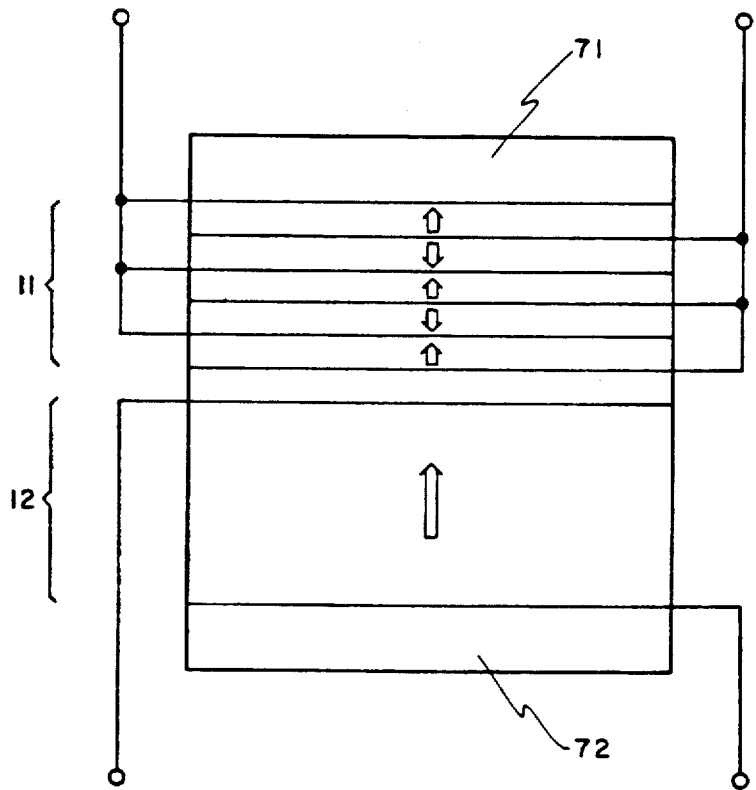
FIG. 25 is a schematic diagram of an embodiment of the piezoelectric transformer of FIG. 10 having a four-terminal structure.

Besides the four-terminal wiring schematically shown in FIG. 25 gave a similar result of transmission efficiency exceeding 96%.

EXAMPLE 6

Figure 26:
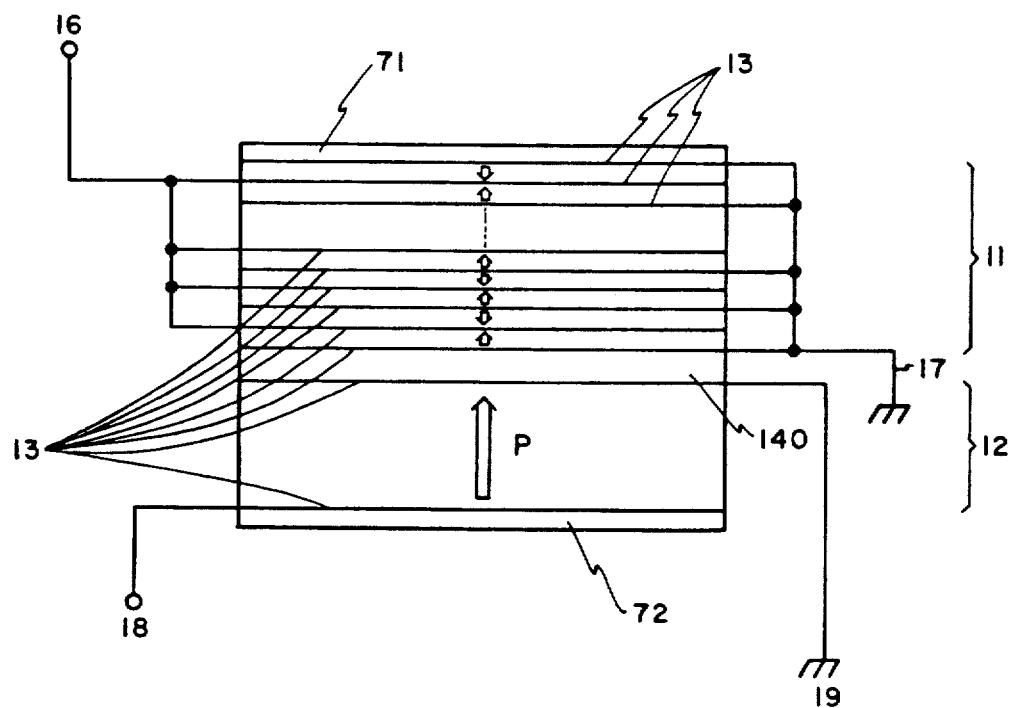
FIG. 26 is a schematic diagram of an alternative embodiment of the four-terminal piezoelectric transformer of FIG. 14.

An Example of four-terminal piezoelectric transformer schematically illustrated in FIG. 26 comprising an insulator layer between the high and low impedance portions was made by the green sheet technique. It was made of lead titanate piezoelectric ceramic. The low impedance portion 11 was multi-layered structure consisting of ten piezoelectric ceramic layers each being of 0.09 to 0.10 mm in thickness. The insulator layer 140 was made of the same material and its layer was about 0.3 mm thick. The high impedance portion 12 had a thickness of about 1.2 mm. The frequency adjusting layers 71, 72 were made of the same material and its thickness was about 0.1 mm, but of course may be made of other suitable material if it can be sintered integrally with the low and high impedance portions 11 and 12. After screen-printing of Pt-type paste, integral sintering including piezoelectric ceramic layers was carried out to form intermediate Pt electrode layers. Pt-type paste was prepared by uniformly mixing an adequate amount of the piezoelectric ceramic powder to increase a peeling-off strength for the electrode after sintering. Following sintering was made the parallel and plane lapping on the top and bottom surface, respectively, with #3000 abrasive. Subsequently polarization was made by application of high DC voltage. This example appreciated to be a voltage step-down type four-terminal transformer so constructed that high frequency voltage signals exciting the second thickness-extensional mode ($\lambda$ resonant mode) input through terminals 18 and 19 of the high impedance portion 12 were step down and output through terminals 16 and 17 of the low impedance portion 11.

Figure 27:
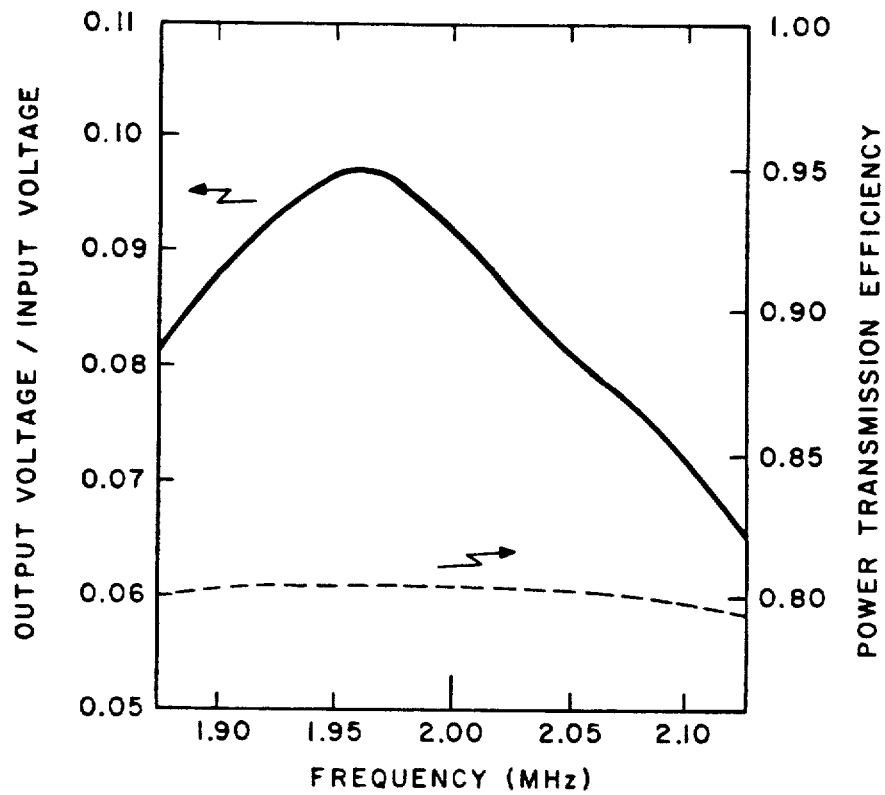
FIGS. 27 and 28 are graphs showing the frequency characteristics of the piezoelectric transformer of FIG. 26.
Figure 28:
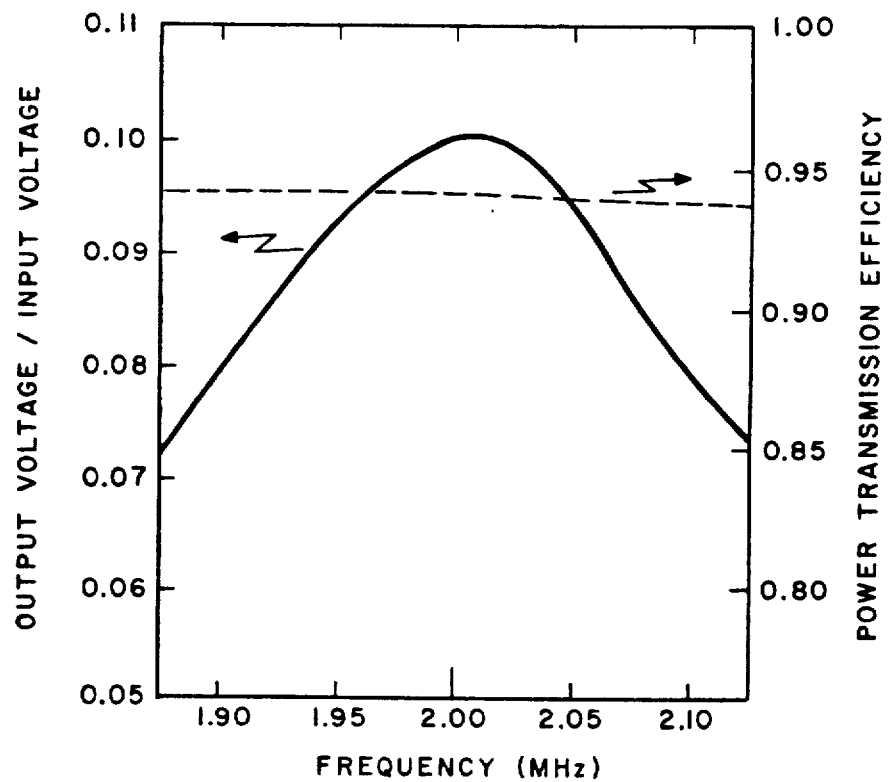

The frequency characteristic of the piezoelectric ceramic transformer sintered but followed by no further processing is shown in FIG. 27. The resonant frequency i 1.95 MHz, and the power transmission efficiency is a low value as low as 80%. On the other hand, after the top and bottom surfaces were subjected to the parallel and plane grinding gave the frequency characteristic plotted in FIG. 28, as of resonant frequency 2.00 MHz and a high power transmission efficiency as high as not less than 94%.

Besides the piezoelectric transformer operated in $\lambda/2$ resonance with a transmission efficiency 91% at resonant frequency of 1 MHz, and a somewhat narrower ratio band width of 80% compared with the value in the aforesaid $\lambda$ resonance.

EXAMPLE 7

Figure 29A:
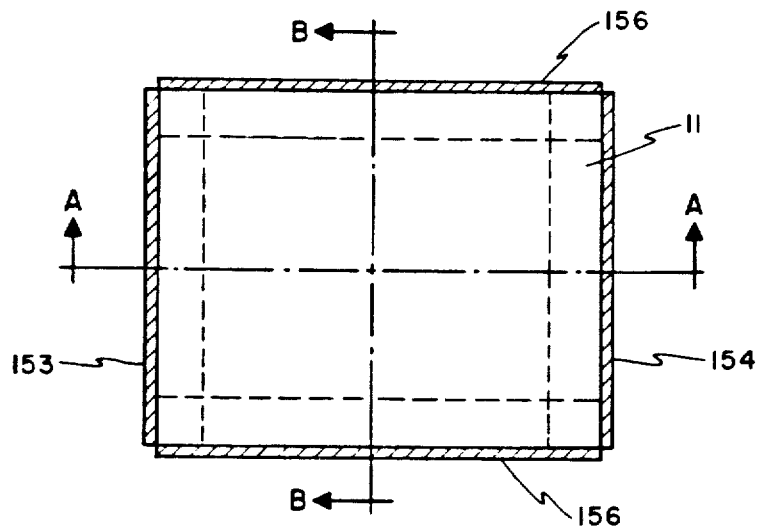
FIG. 29A is a plan view illustrative of an alternative embodiment of the four-terminal piezoelectrick transformer of FIG. 26.
Figure 29B:
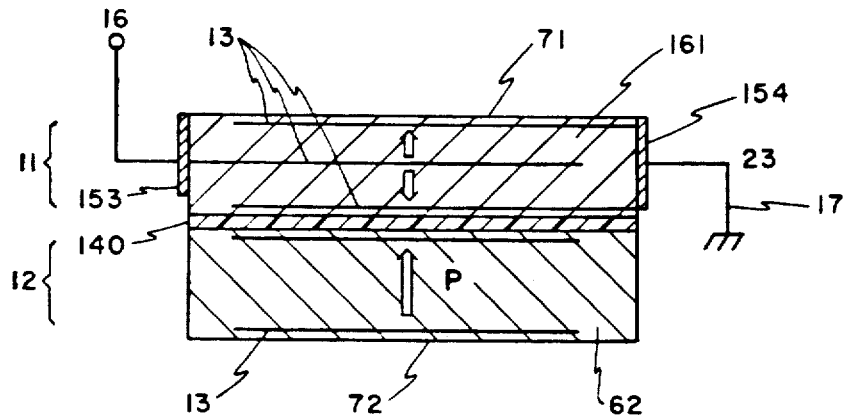
FIG. 29B is a cross-sectional view taken along line B—B of FIG. 29A.
Figure 29C:
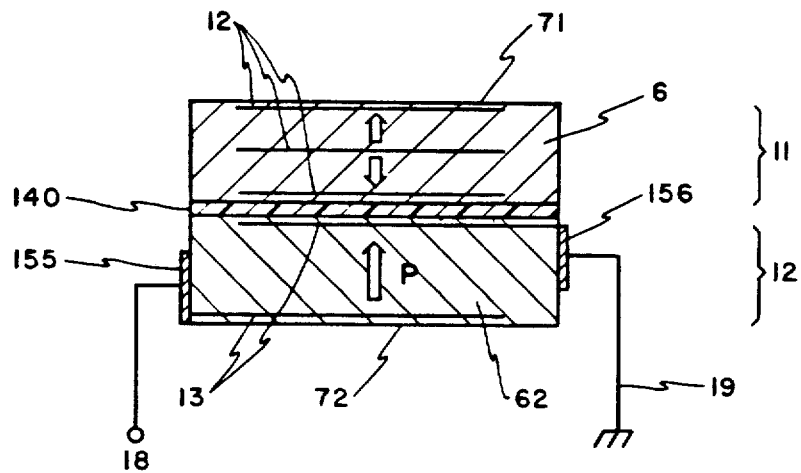
FIG. 29C is a cross-sectional view taken along C—C of FIG. 29A.

A modified Example of the piezoelectric transformer of FIG. 26 is illustrated in FIG. 29. It is a piezoelectric transformer comprising a relatively small number of intermediate electrodes, and operating in thickness-extensional vibration mode, which is composed of a drive or high impedance portion 12 of lead titanate piezoelectric ceramic and an output or low impedance portion 11 of PZT piezoelectric ceramic. FIG. 29(A) is a plan view, and FIGS. 29(B) and 29(C) are cross-sectional views taken along lines B—B and C—C, respectively. In this Example, the drive portion 12 is made of lead titanate piezoelectric ceramic having, as a characteristic, a very small electromechanical coupling coefficient $k_{31}$, thus to prevent spurious resonance from appearing. The resonant frequency of the spurious resonance is functional to lengthwise dimension based on piezoelectric transverse effect, and thus lengthwise dimension can be set freely.

Besides if the fact that the combination of lead titanate piezoelectric ceramic and PZT piezoelectric ceramic, as based on that the dielectric constant of the PZT piezoelectric ceramic is 5 to 20 times more than the dielectric constant of lead titanate piezoelectric ceramic is utilized, then more transformation ratio (in this case, output voltage to input voltage) can be attained even in a relatively smaller number of intermediate electrodes of the PZT piezoelectric ceramic.

Besides a four-terminal piezoelectric transformer can be realized by the insertion of an insulator layer 140 between the drive or high impedance portion 12 and the generator or low impedance portion 11. It allows to extend remarkably field of use, compared with the three-terminal piezoelectric transformer having a common ground terminal.

Each of the high and low impedance portions 12 and 11 of the Example of piezoelectric transformer were made separately by the ceramic lamination technique (Doctor Blade method). Both piezoelectric ceramic impedance portions 12 and 11 were subjected to parallel and plane lapping with #3000 abrasive by a lapping machine. Alumina plate with which the insulator layer 140 was formed was coated with a solid Cr/Pb/Au coating (the coating film is not shown) of 8000 Å thick by vacuum evaporation on the surface previously polished to a high planeness of up to 1 μm. Both piezoelectric impedance portions 11 and 12 having Pt-type internal electrode 13 was adhered firmly with solder film (not shown) by induction heating. In this way, this Example of piezoelectric transformer was fabricated. Using solder is based on the reason that a piezoelectric transformer accompanied by a small mechanical vibration loss and having a high Q value (quality factor) compared with joining with epoxy resin can be realized. Then corrective adjusting ceramic layers 71 and 72 on the top and bottom surfaces of the piezoelectric transformer were subjected to the parallel and plane lapping. Thus a piezoelectric transformer operating at a resonant frequency of 2.0 MHz and in λ thickness-extensional mode was obtained. The transformer is provided with side electrodes 153 through 156 were formed as shown, which were connected to terminals 16 through 19, respectively. The piezoelectric transformer has outside dimension of 12 mm length and 9 mm width, 0.91 mm thickness of high impedance vibrator portion 12, 0.2 mm thickness of insulator layer 140, and 0.67 mm thickness of the low impedance vibrator 11. This test piezoelectric transformer showed a mechanical Q value of about 1000, a maximum efficiency of 95%, and a transformation ratio (output voltage-to-input voltage) of 0.075 at 2.0 MHz. One of reasons for using λ mode resides in making it possible to take greater band width by connecting a proper load compared with other modes such as λ/2 mode. The other reason resides in that a loop of vibration falls on the insulator plate part and the concentration of vibration stress on the solder-connection part can be avoided.

Besides in this Example, a piezoelectric ceramic transformer was made not by integral sintering but by soldering because the two kinds of piezoelectric ceramics are sintered with slightly different shrinkages. It is a matter of course that as long as the same shrinkages result from the sintering, even if made of two different materials, integral sintering can be achieved. In this case, of course, lead titanate material of relatively small dielectric constant is suitable for using as the insulator layer 140.

As described above, piezoelectric ceramic transformers according to the invention has advantages not only of being usable at high frequency bands of 1 MHz or higher but also of so small size and high efficiency that conventional piezoelectric transformers have not, and thus has great industrial value.

What is claimed is:

1. A thickness mode vibration piezoelectric transformer of a laminated structure comprising:
    a first thickness mode vibrator portion having a first piezoelectric layer interposed respectively between a first pair of electrode layers, said first piezoelectric layer being polarized in the direction of thickness thereof; and
    a second thickness mode vibrator portion stacked on said first thickness mode vibrator portion and having a second piezoelectric layer interposed between a second pair of electrode layers disposed parallel to said first pair of electrode layers, said second piezoelectric layer being polarized in the direction of thickness thereof, said first and second thickness mode vibrator portions have different impedances, a total thickness of said transformer in the direction perpendicular to said electrode layers being equal to half wavelength (λ/2) or one wavelength (λ) of a driving frequency for said transformer, and at least three external terminals connected to said first and second pair of layers, an insulator layer being interposed between said first and second thickness mode vibrator portions, said insulator layer having a lower dielectric constant than the dielectric constant of said first and second piezoelectric layers and having a thickness which is smaller than 20% of said total thickness of said transformer.

2. A thickness mode vibration piezoelectric transformer according to claim 1, wherein said second piezoelectric layer is divided into a plurality of layers by at least one of third electrode layers disposed between said second pair of electrode layers and adjacent electrode layers of said second thickness mode vibrator portion are connected to a different two of said external terminals so that the impedance of said second thickness mode vibrator portion becomes lower than the impedance of said first thickness mode vibrator portion.

3. A thickness mode vibration piezoelectric transformer according to claim 2, wherein the dielectric constant of said second piezoelectric layer is higher than the dielectric constant of said first piezoelectric layer so that the impedance of said second thickness mode vibrator portion is lower than the impedance of said first thickness mode vibrator portion.

4. A thickness mode vibration piezoelectric transformer according to claim 2, wherein a frequency adjusting ceramic layer is provided on the bottom face of said first thickness mode vibrator portion and on the top face of said second thickness mode vibrator portion, respectively.

5. A thickness mode vibration piezoelectric transformer according to claim 2, wherein the relationships between the dimension (t) of said transformer in the perpendicular direction to said electrode layers and each of the width (S) and length (L) of said transformer in the parallel direction to said electrode layers are selected within the ranges of $0.2t \leq S \leq 0.8t$ and $L \geq 5.5t$, respectively.

6. A thickness mode vibration piezoelectric transformer having a laminated structure, said transformer comprising:
    a first thickness mode vibrator portion having a first piezoelectric layer interposed between a first pair of electrode layers, said first piezoelectric layer being polarized in the direction of its thickness; and
    a second thickness mode vibrator portion stacked on said first thickness mode vibrator portion and having a second piezoelectric layer interposed between a second pair of electrode layers disposed parallel to said first pair of electrode layers, said second piezoelectric layer being polarized in the direction of its thickness, said first and second thickness mode vibrator portions have different impedances, wherein the relationships between the dimension (t) of said transformer in the direction perpendicular to said electrode layers and each of the width (S) and the length (L) of said transformer in the parallel direction to said electrode layers are selected to be within the ranges of $0.2t \leq S \leq 0.8t$ and $L \geq 5.5t$, respectively, and at least three external terminals connected to said first and second pair of electrode layers.

* * * * *